(12) United States Patent
Lisseman et al.

(10) Patent No.: US 12,039,119 B2
(45) Date of Patent: Jul. 16, 2024

(54) SWITCH ASSEMBLY AND METHODS OF USE

(71) Applicant: JOYSON SAFETY SYSTEMS ACQUISITION LLC, Auburn Hills, MI (US)

(72) Inventors: Jason Lisseman, Shelby Township, MI (US); David Andrews, Ortonville, MI (US); Daniel Alt, Auburn Hills, MI (US); Nicholas Borgerding, St. Clair Shores, MI (US); Jason Peters, Auburn Hills, MI (US); Erick Staszak, Clarkston, MI (US); Prathap Chandra, Auburn Hills, MI (US)

(73) Assignee: JOYSON SAFETY SYSTEMS ACQUISITION LLC, Auburn Hills, MI (US)

( * ) Notice: Subject to any disclaimer, the term of this patent is extended or adjusted under 35 U.S.C. 154(b) by 0 days.

(21) Appl. No.: 18/200,345

(22) Filed: May 22, 2023

(65) Prior Publication Data

US 2023/0297183 A1 Sep. 21, 2023

Related U.S. Application Data

(63) Continuation of application No. 17/700,190, filed on Mar. 21, 2022, now Pat. No. 11,693,505, which is a
(Continued)

(51) Int. Cl.
*G06F 3/041* (2006.01)
*G06F 3/01* (2006.01)
(Continued)

(52) U.S. Cl.
CPC ............ *G06F 3/0414* (2013.01); *G06F 3/016* (2013.01); *G06F 3/0418* (2013.01); *G06F 3/167* (2013.01);
(Continued)

(58) Field of Classification Search
CPC ........ G06F 3/0414; G06F 3/016; G06F 3/167; G06F 3/0418; H01H 13/85; H01H 13/83; H03K 17/9625
See application file for complete search history.

(56) References Cited

U.S. PATENT DOCUMENTS

| 6,636,197 B1 | 10/2003 | Goldenberg et al. |
| 9,690,380 B2 | 6/2017 | Monkhouse et al. |

(Continued)

FOREIGN PATENT DOCUMENTS

| WO | 2004038573 A2 | 5/2004 |
| WO | 2016096700 A1 | 6/2016 |

OTHER PUBLICATIONS

International Search Report and Written Opinion issued for International Application No. PCT/US2018/012333, dated Apr. 24, 2018, 18 pages.

(Continued)

*Primary Examiner* — Hang Lin
(74) *Attorney, Agent, or Firm* — Meunier Carlin & Curfman LLC

(57) ABSTRACT

Various implementations include a switch assembly that includes a housing and at least two printed circuit boards (PCBs) that are disposed within the housing and are axially arranged relative to each other. One or more force sensors are disposed on one of the PCBs, and, in some implementations, the one or more force sensors receive force input received by a touch overlay plate. Signals from the force sensors are processed to determine a magnitude, acceleration, and/or location of the force input, and a haptic feedback response is received by the touch overlay plate. The haptic feedback response is based on the force magnitude, acceleration, and/or location of input, according to some implementations. Axially arranging the PCBs reduces the footprint of the switch assembly and allows for the inclusion of
(Continued)

more electrical components in the switch assembly, according to some implementations.

20 Claims, 21 Drawing Sheets

Related U.S. Application Data continuation of application No. 16/916,430, filed on Jun. 30, 2020, now Pat. No. 11,281,322, which is a continuation of application No. 15/861,986, filed on Jan. 4, 2018, now Pat. No. 10,707,034.

(60) Provisional application No. 62/442,306, filed on Jan. 4, 2017.

(51) Int. Cl.
| | |
|---|---|
| *G06F 3/16* | (2006.01) |
| *H01H 13/83* | (2006.01) |
| *H01H 13/85* | (2006.01) |
| *H03K 17/96* | (2006.01) |
| *B62D 1/04* | (2006.01) |

(52) U.S. Cl.
CPC ............ *H01H 13/83* (2013.01); *H01H 13/85* (2013.01); *H03K 17/9625* (2013.01); *B62D 1/04* (2013.01); *G06F 2203/04106* (2013.01); *H03K 2217/96062* (2013.01)

(56) References Cited

U.S. PATENT DOCUMENTS

| | | | |
|---|---|---|---|
| 9,746,168 B1* | 8/2017 | Wu | ........................ H03K 17/96 |
| 10,149,370 B2 | 12/2018 | Greene et al. | |
| 10,707,034 B2 | 7/2020 | Lisseman et al. | |
| 2008/0142345 A1 | 6/2008 | Heite et al. | |
| 2009/0267906 A1 | 10/2009 | Schroderus | |
| 2010/0200375 A1 | 8/2010 | Han et al. | |
| 2012/0267222 A1 | 10/2012 | Gohng et al. | |
| 2013/0032002 A1 | 2/2013 | Kuntzel | |
| 2013/0033841 A1* | 2/2013 | Eckhardt | .............. H01R 12/585 |
| | | | 361/784 |
| 2014/0354568 A1* | 12/2014 | Andrews | ................ B60R 16/023 |
| | | | 345/173 |
| 2015/0066245 A1 | 3/2015 | Lee et al. | |
| 2015/0097791 A1 | 4/2015 | Lisseman et al. | |
| 2015/0097793 A1 | 4/2015 | Lisseman et al. | |
| 2015/0097794 A1 | 4/2015 | Lisseman et al. | |
| 2015/0097795 A1 | 4/2015 | Lisseman et al. | |
| 2016/0123827 A1* | 5/2016 | Lee | ........................ G01L 9/0002 |
| | | | 73/723 |
| 2016/0197608 A1 | 7/2016 | Moyer et al. | |

OTHER PUBLICATIONS

Office Action issued for German Application No. 112018000308, dated Dec. 9, 2022.Machine translation included.

Office Action issued for Chniese Application No. 201880015815.3, dated Nov. 30, 2022. Machine translation included.

\* cited by examiner

SWITCH ASSEMBLY AND METHODS OF USE

CROSS REFERENCE TO RELATED APPLICATION

This application is a continuation application of U.S. patent application Ser. No. 17/700,190 filed Mar. 21, 2022, which is a continuation application of U.S. patent application Ser. No. 16/916,430 filed Jun. 30, 2020, which issued as U.S. Pat. No. 11,281,322 issued on Mar. 22, 2022, which claims priority to and benefit of U.S. patent application Ser. No. 15/861,986 filed Jan. 4, 2018, which issued as U.S. Pat. No. 10,707,034 on Jul. 7, 2020, which claims priority to and benefit of U.S. Provisional Patent Application No. 62/442,306 filed Jan. 4, 2017, each of which are fully incorporated by reference and made a part hereof.

BACKGROUND

Conventional capacitive sense touchscreen technologies, such as those used in smartphones and tablet devices, require significant visual engagement by a driver, which is a distraction for the driver and compromises safety. Conventional mechanical switches and knobs are less distracting because they can be safely used without requiring the driver to remove his eyes from the road, but they tend to have limited flexibility, with each switch controlling a single function or feature.

Thus, there is a need in the art for a switch assembly that provides sufficient feedback to the driver upon receiving driver input to avoid distracting the driver and that provides the ability to control multiple functions and/or vehicle systems with a minimal footprint.

BRIEF DESCRIPTION OF THE DRAWINGS

These and other features, aspects, and advantages of the present invention will become apparent from the following description and the accompanying exemplary implementations shown in the drawings, which are briefly described below.

FIGS. 10A and 1013 illustrate perspective views of the annular frame shown in FIG. 2.

DETAILED DESCRIPTION

Figure 1:
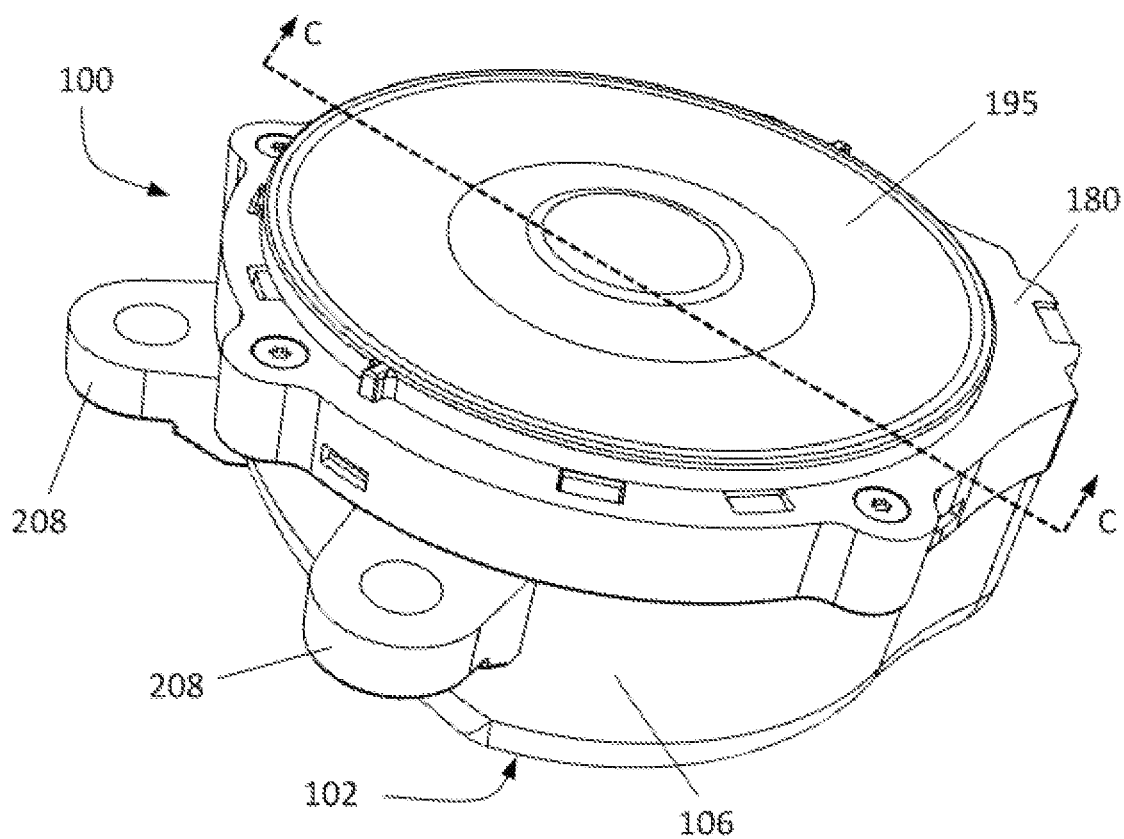
FIG. 1 illustrates a perspective view of a switch assembly according to one implementation.
Figure 2:
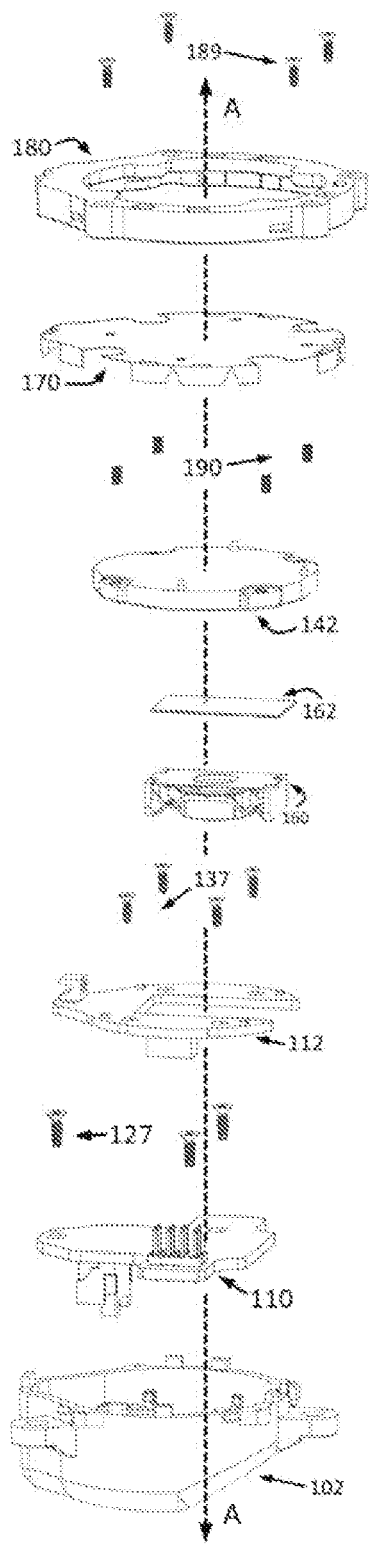
FIG. 2 illustrates an exploded view of part of the switch assembly shown in FIG. 1.

Various implementations include a switch assembly that includes a housing and at least two printed circuit boards (PCBs) that are disposed within the housing and are axially arranged relative to each other. One or more force sensors are disposed on one of the PCBs, and, in some implementations, the one or more force sensors receive force input received by a touch overlay plate. Signals from the force sensors are processed to determine a magnitude, acceleration, and/or location of the force input, and a haptic feedback response is received by the touch overlay plate. The haptic feedback response is based on the force magnitude, acceleration, and/or location of input, according to some implementations. Axially arranging the PCBs reduces the footprint of the switch assembly and allows for the inclusion of more electrical components in the switch assembly, according to some implementations.

Various implementations are described in detail below in accordance with the figures.

For example, FIGS. 1-12 illustrate a switch assembly according to one implementation. The switch assembly 100 includes a housing 102, a first printed circuit board (PCB) 110, a second PCB 112, a light guide 142, a membrane 170, an optional touch overlay plate 195, and an annular frame 180.

The housing 102 has a first wall 104 and a second wall 106 that define a chamber 108. The second wall 106 extends axially from a radial outer edge 105 of the first wall 104, forming a side wall. A distal edge 172 of the second wall 106 defines an opening to the chamber 108. Longitudinal axis A-A extends through a center of the chamber 108 and the first wall 104.

Two or more PCBs are arranged axially adjacent each other within the chamber 108. In particular, a first PCB 110 is disposed within the chamber 108 adjacent the first wall 104, and a second PCB 112 is axially adjacent and spaced apart from the first PCB 110 within the chamber 108. A first electrical connector 114 extends from a second surface 116 of the first PCB 110, and a second electrical connector 117 extends from a first surface 118 of the second PCB 112. These electrical connectors 114, 117 are axially aligned and coupled together to allow electrical communication between the PCBs 110, 112. The first PCB 110 also includes a third electrical connector 120 extending from a first surface 122 of the first PCB 110. The third electrical connector 120 is electrically coupled with a vehicle communication bus, for example. In the implementation shown, the third electrical connector 120 is axially arranged relative to the first electrical connector 114, but the connectors 120, 114 are not axially aligned. However, in other implementations, the third electrical connector 120 is axially aligned with the first electrical connector 114.

The first wall 104 of the housing includes a first set of one or more projections 125 that extend inwardly into the chamber 108 in the direction of axis A-A. The first surface 122 of the first PCB 110 is disposed on a distal surface 125*a* of the first set of one or more projections 125 such that the first surface 122 is spaced apart from the first wall 104. The first PCB 110 defines openings 124, and the first set of projections 125 define openings 126 that are axially aligned with openings 124. A fastener 127 is engaged through respective pairs of aligned openings 124, 126 to couple the first PCB 110 to the projections 125 and prevent relative movement of the first PCB 110 within the chamber 108. Although three fasteners are shown, more or less fasteners may be selected. In other implementations, other fastening arrangements may be selected. For example, other fastening arrangements include a friction fit within the housing, snaps, clips, rivets, adhesive, or other suitable fastening mechanism.

Figure 5:
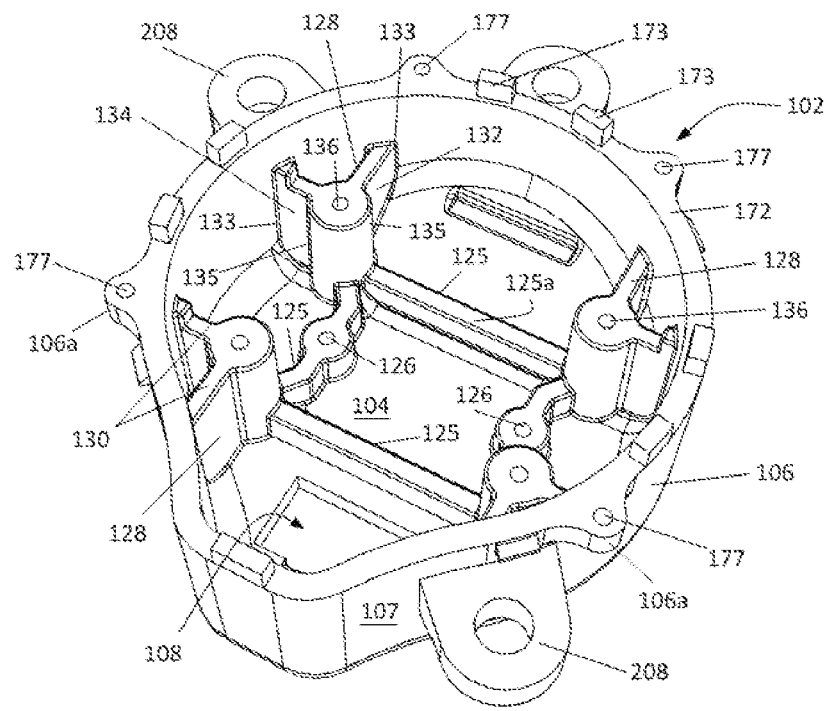
FIG. 5 illustrates a perspective view of the housing shown in FIG. 2.
Figure 6:
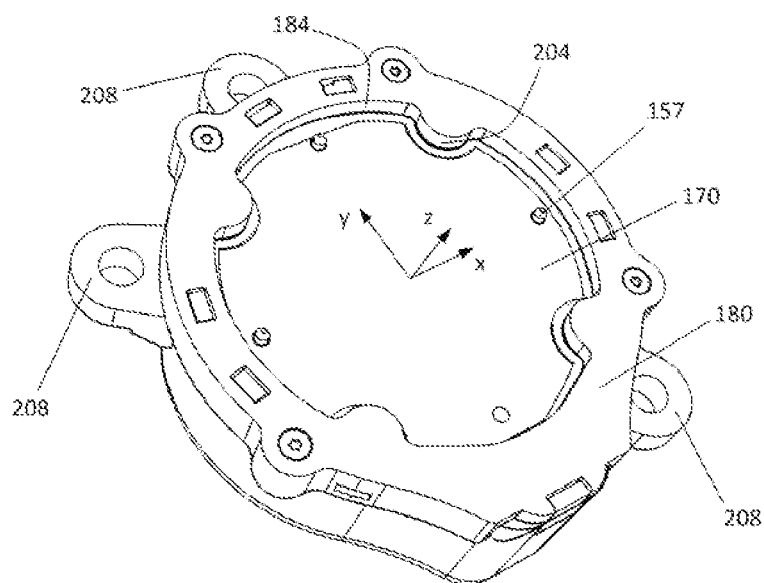
FIG. 6 illustrates a perspective view of the switch assembly shown in FIG. 2 partially assembled.
Figure 7:
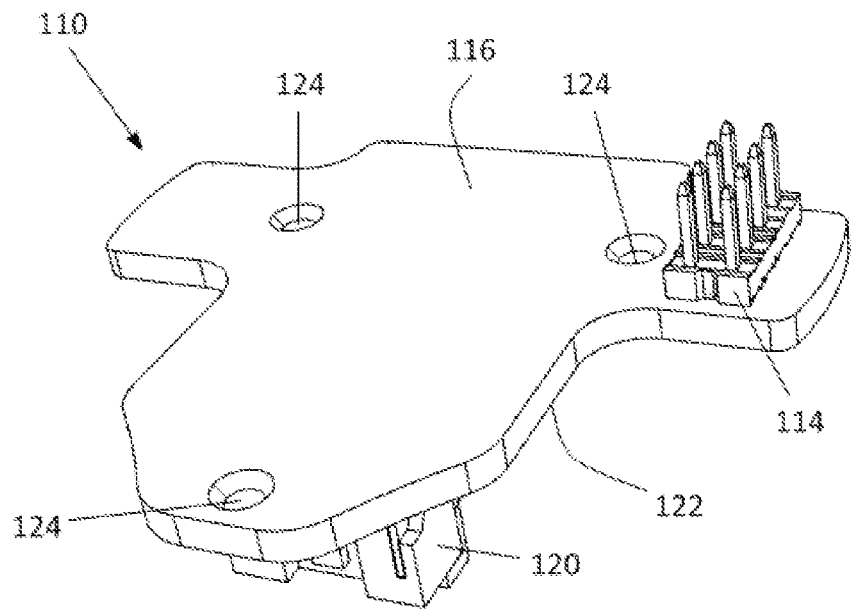
FIG. 7 illustrates a perspective view of the second surface of the first PCB shown in FIG. 2.
Figure 8:
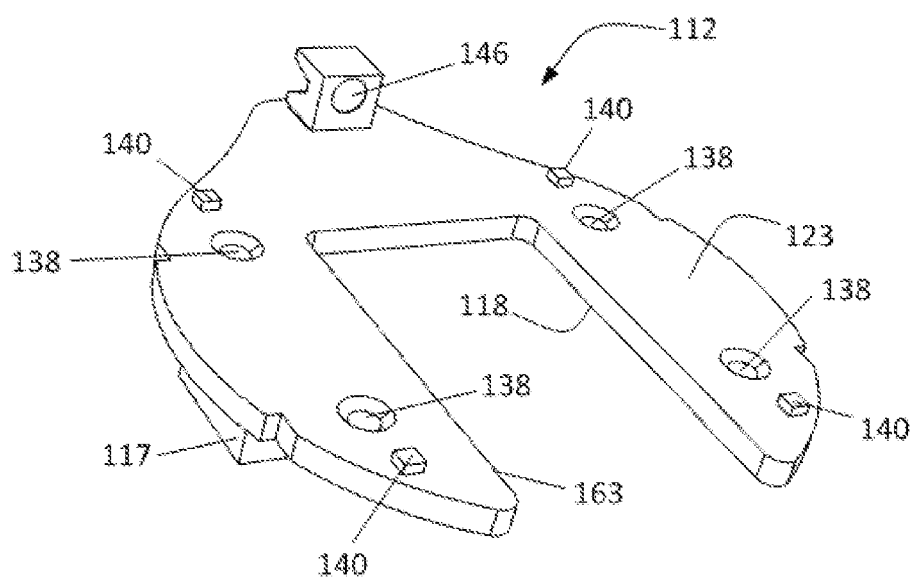
FIG. 8 illustrates a perspective view of the second surface of the second PCB shown in FIG. 2.

A second set of projections 128 extend axially inwardly into the chamber 108 from the first wall 104 and radially inwardly into the chamber 108 (e.g., in a direction perpendicular to and toward the axis A-A) from the second wall 106. The second set of projections 128 are spaced apart from each other. As shown in FIG. 5, each projection 128 includes a first rib 132 and a second rib 134. Each rib 132, 134 includes a proximal edge 133 that is coupled to the second wall 106 and a distal edge 135 that is spaced radially inwardly into the chamber 108 from the proximal edge 133. The distal edges 135 of ribs 132, 134 intersect and define a boss 136. Projections 125 extend between projections 128, but the surface 125*a* of each projection 125 is spaced apart from a surface 130 of each projection 128. In particular, a plane that includes surface 125*a* is spaced axially between the first wall 104 and a plane that includes surface 130. The first surface 118 of the second PCB 112 is disposed on the surfaces 130 of projections 128 such that openings 138 defined in the second PCB 112 are axially aligned with openings defined by the bosses 136. Fasteners 137 extend through each pair of aligned openings 138, 136 to couple the second PCB 112 to the projections 128 and prevent relative movement of the second PCB 112 within the chamber 108. Although four fasteners are shown, more or less fasteners may be selected. In other implementations, other fastening arrangements may be selected. For example, other fastening arrangements include a friction fit within the housing, snaps, clips, rivets, adhesive, or other suitable fastening mechanism.

The first PCB 110 has an outer perimeter that is shaped to fit within the chamber 108 and between the second set of projections 128, which allows the first surface 122 of the first PCB 110 to be disposed on the surface 125*a* of projections 125. The second PCB 112 also has an outer perimeter that is shaped to fit within the chamber 108 such that the first surface 118 of the second PCB 112 engages the ribs 132, 134 of the second set of projections 128.

A plurality of force sensors 140 are disposed on the second surface 123 of the second PCB 112 and are spaced apart from each other. The force sensors 140 are axially aligned with respective first ribs 132 and/or second ribs 134. This arrangement allows force to be applied in the z-direction (i.e., along central longitudinal axis A-A) toward the force sensors 140, and the surfaces 130 of the projections 128 prevent the second PCB 112 from bending or flexing where the force sensors 140 are coupled to the second PCB 112 in response to the force applied, which prevents the force sensors 140 from being damaged. The surfaces 130 of the projections 128 also prevent axial movement of the second PCB 112 relative to the first PCB 110 and the housing 102 when force is received by the force sensors 140. In one implementation, the force sensors 140 comprise micro electro-mechanical sensors (MEMS) that provide an output signal that corresponds with an amount of force received by the sensors. For example, the MEMS force sensors are able to detect force with as little as 2 microns of displacement.

The light guide 142 is disposed within the chamber 108 and includes a first surface 144, a second surface 143 that is opposite and spaced apart from the first surface 144, and a side edge 145 that extends between the first surface 144 and the second surface 143. The first surface 144 of the light guide 142 faces the force sensors 140 coupled to the second PCB 112. The light guide 142 is a plate made from a transparent or translucent material. For example, the light guide 142 may comprise a rigid material, such as acrylic or a polycarbonate material. At least one light source is disposed on the second surface 123 of the second PCB 112. For example, in some implementations, the light source includes a light emitting diode (LED) 146, and the side edge 145 of the light guide 142 is disposed radially adjacent the LED 146. Light from the LED 146 travels through the side edge 145 of the light guide 142 and exits from the second surface 143 of the light guide 142. With this system, a single light source or multiple light sources are disposed on the same side, adjacent sides, or opposing sides of the light guide 142, and the light is directed toward the second surface 143 of the light guide 142. However, in other implementations, the light may enter the light guide 142 through the first surface 144 of the light guide 142.

In some implementations, the second surface 143, first surface 144, and/or side edge 145 of the light guide 142 include integrally formed micro-lenses to direct light through the light guide 142 and out of the second surface 143. For example, FIG. 9C illustrates a plurality of micro-lenses 147, which include protrusions and/or recessed portions, on the first surface 144 of the light guide 142. In other or further implementations, one or more light altering films are disposed on one or more of the light guide surfaces 143, 144 and/or side edge 145 of the light guide 142.

Figure 9A:
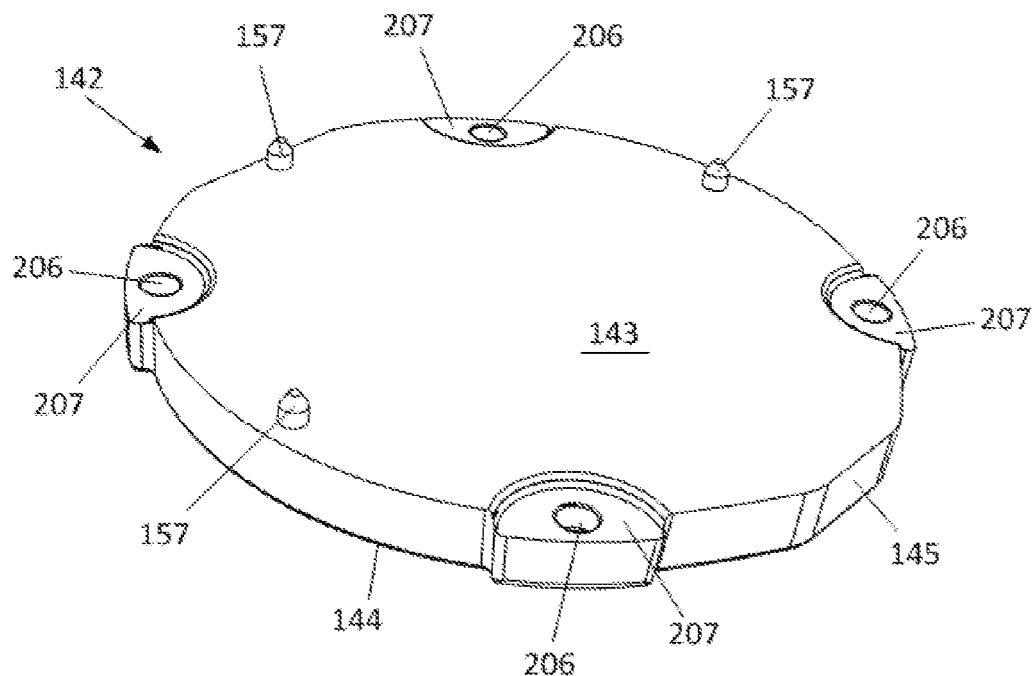
FIG. 9A illustrates a perspective view of the second surface of the light guide shown in FIG. 2.
Figure 9B:
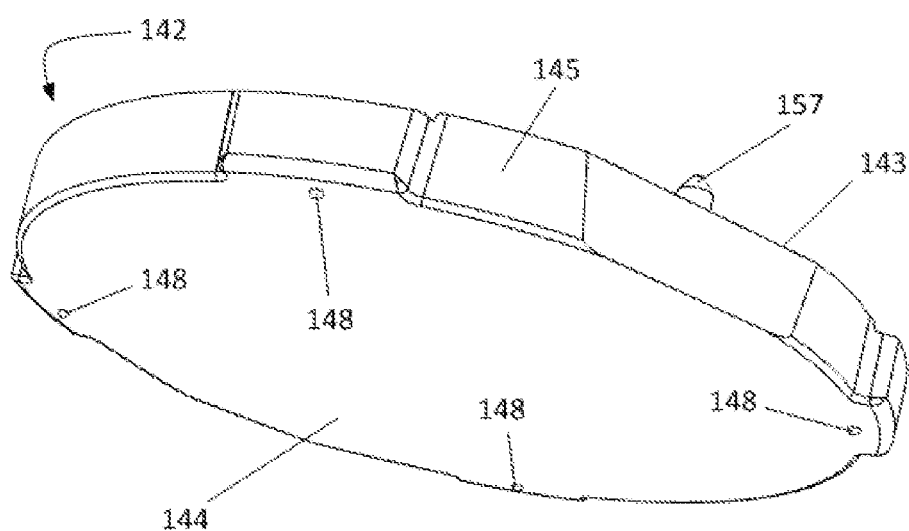
FIG. 9B illustrates a perspective view of the first surface of the light guide shown in FIG. 2.
Figure 9C:
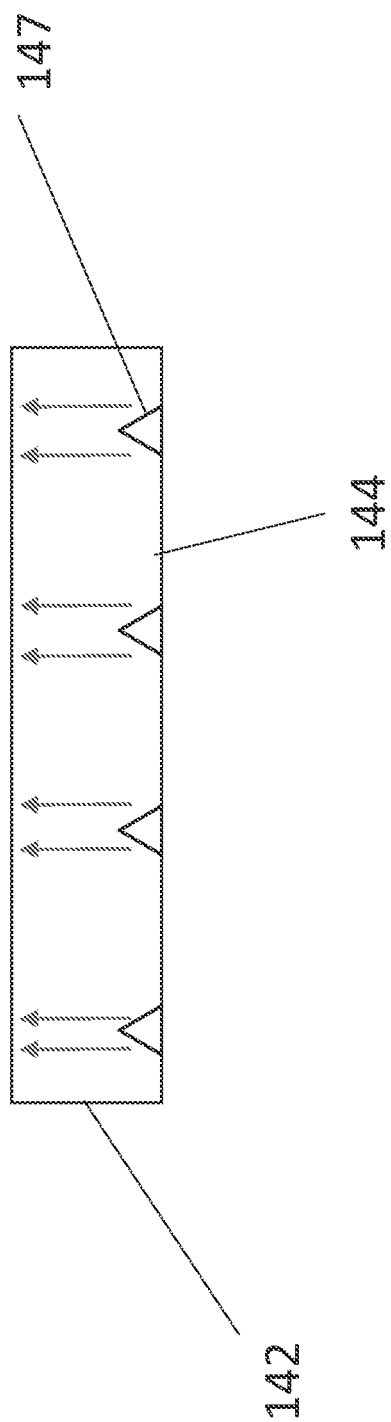
FIG. 9C illustrates a cross sectional view of the light guide shown in FIG. 2.
Figure 10A:
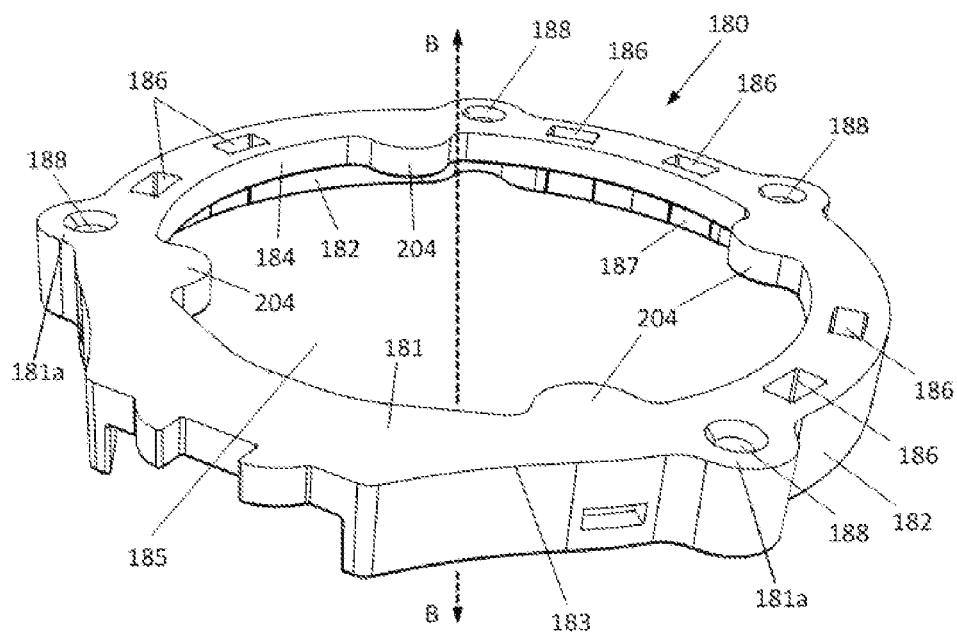
Figure 10B:
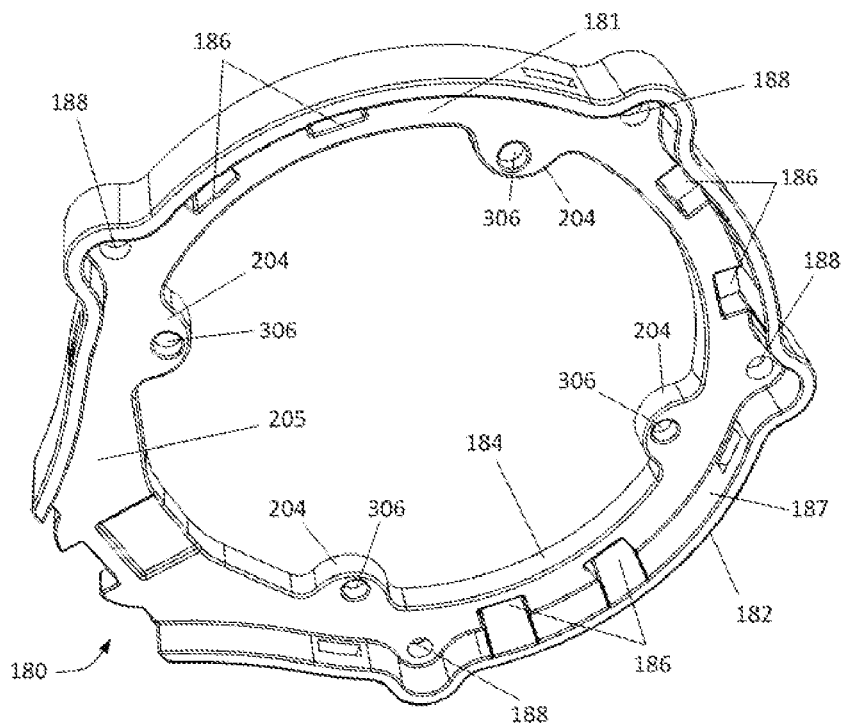
Figure 11:
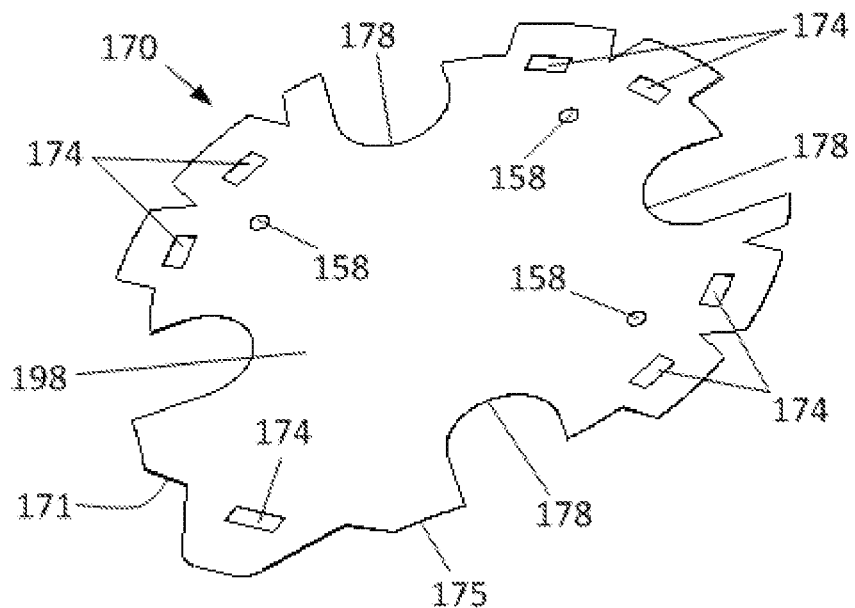
FIG. 11 illustrates a perspective view of the membrane shown in FIG. 2.

In the implementation shown in FIG. 9B, the first surface 144 of the light guide 142 includes a plurality of protrusions 148 that extend axially from the first surface 144. The protrusions 148 axially align with the force sensors 140 on the second PCB 112. The protrusions 148 concentrate the force received by the light guide 142 onto the force sensors 140. In one implementation, the protrusions 148 are integrally formed with the first surface 144. However, in other implementations, the protrusions 148 may be formed separately and coupled to the first surface 144.

Figure 13:
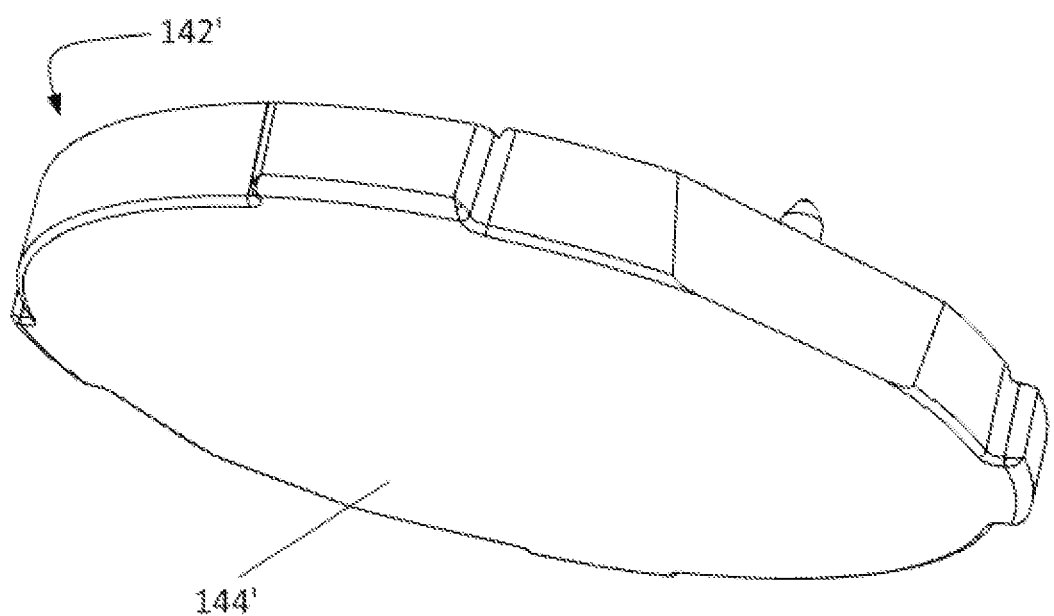
FIG. 13 illustrates perspective view of a first surface of a light guide according to another implementation.

In another implementation shown in FIG. 13, the first surface 144' of the light guide 142' is planar, and a force concentrator that is separately formed from the light guide 142' is disposed between each force sensor and the first surface 144' of the light guide 142'. Each force concentrator transfers force received by the light guide 142' to the respective force sensor below the force concentrator.

The haptic exciter 160 provides haptic feedback to a user. For example, according to one implementation, the haptic exciter 160 is a speaker (e.g., a coneless voice coil assembly), and the haptic output is an audible or inaudible sound wave that changes the air pressure near an output surface of the speaker by propagating a plurality of pressure waves along an axis of propagation. The propagation axis is perpendicular to an output surface 161, and in the implementation shown, is parallel to central axis A-A, which extends orthogonally to and through the surfaces 196, 197 of the touch plate 195. For example, the propagation axis may be co-axial with axis A-A in some implementations. In the implementation shown in FIGS. 1-12, the output surface 161 of the haptic exciter 160 is coupled directly to the first surface 144 of the light guide 142. Thus, at least a portion of the pressure waves propagated from the output surface 161 are directed toward and are captured by the first surface 144 of the light guide 142, which causes vibration, or oscillation, of the light guide 142 in the z-direction. In this implementation, the first surface 144 of the light guide 142 serves as the reaction surface for the exciter 160. The vibration of the light guide 142 is transferred to the membrane 170 and to the touch plate 195. Thus, the haptic exciter 160 is vibrationally coupled to the inner surface 196 of the touch plate 195 because pressure waves originating from the haptic exciter 160 induce a vibratory response on the touch plate 195. In some implementations, the haptic exciter 160 is coupled to the first surface 144 of the light guide 142 using an adhesive 162. However, in other implementations, other suitable fastening mechanisms may be used. And, in other implementations, the output surface 161 of the haptic exciter 160 is disposed axially adjacent and spaced apart from the first surface 144 of the light guide 142. In addition, in some implementations, the haptic exciter 160 is disposed adjacent a central portion of the first surface 144 of the light guide 142.

Figure 4:
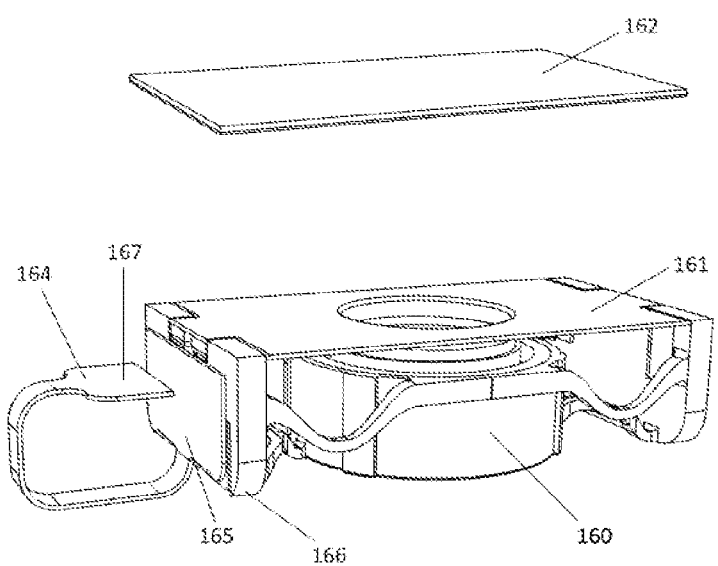
FIG. 4 illustrates a perspective view of the haptic exciter shown in FIG. 2.

As shown in FIG. 4, the haptic exciter 160 includes a flexible cable connector 164 that has a first end 165 that is coupled to a first end 166 of the haptic exciter 160 and a second end 167 that is coupled to the first surface 118 of the second PCB 112. The flexible cable connector 164 minimizes or eliminates transmission of the vibration from haptic exciter 160 to the second PCB 112 while allowing the haptic exciter 160 to be electrically coupled to the second PCB 112. In one non-limiting example, the flexible cable connector may be a zero insertion force (ZIF)-type connector. In alternative implementations, the haptic exciter 160 is coupled to the second PCB 112 with wires that are coupled to each via soldering or other suitable coupling mechanism.

In addition, the second PCB 112 defines an opening 163 through which the output surface 161 of the haptic exciter 160 extends for coupling the output surface 161 to the first surface 144 of the light guide 142. This arrangement allows the height in the direction of axis A-A of the switch assembly 100 to be reduced, increases the energy received by the touch overlay 195 from the haptic exciter 160, and reduces the vibrational energy transferred to the second PCB 112. However, in other implementations, the second PCB 112 may not define opening 163, and the haptic exciter 160 may be axially spaced apart from the second surface 123 of the second PCB 112 and disposed between the first surface 144 of the light guide 142 and the second surface 123 of the second PCB 112. By spacing the haptic exciter 160 apart from the second PCB 112, the vibrational energy from the haptic exciter 160 is isolated from the second PCB 112, which allows more of the energy to be received by the light guide 142.

The flexible membrane 170 extends over at least a portion of the chamber 108. A first surface 171 of the flexible membrane 170 faces the second surface 143 of the light guide 142, and at least a portion of these surfaces 171, 143 are coupled together (e.g., by adhesion). A plurality of posts 173 extend axially from the distal edge 172 of the second wall 106 of the housing 102 and are circumferentially spaced apart from each other. The flexible membrane 170 defines a plurality of post openings 174 adjacent a radially outer edge 175 of the membrane 170. The posts 173 are engaged through respective post openings 174 of the membrane 170 to prevent movement of the membrane 170 in the x-y plane (i.e., plane perpendicular to the central axis A-A). In some implementations, the surfaces 171, 143 are coupled together prior to the posts 173 being engaged through the openings 174. By limiting the movement of the membrane 170 to the z-direction, the membrane 170 is able to transfer the vibration from the light guide 142 more efficiently, and the membrane 170 can prevent an x- or y-component of force incident on the switch assembly 100 from being transferred to the force sensors 140, which prevents damage to the force sensors 140 due to shear forces. The membrane 170 may also prevent ingress of fluids or debris into the switch 100.

In the implementation described above, the membrane 170 covers the opening of the chamber 108, but in other implementations, the membrane 170 may only cover a portion of the opening of the chamber 108.

The membrane 170 is formed of a flexible material that is capable of resonating in the z-direction. For example, the membrane 170 may be made of a polymeric material (e.g., polyester, polycarbonate), a thin metal sheet, or other suitable flexible material. In addition, the stiffness of the material for the membrane 170 may be selected based on the amount of resonance desired and in consideration of the load to be incident on the membrane 170.

The touch overlay plate 195 has a first surface 196 and a second surface 197. At least a central portion 201 of the first surface 196 of the touch overlay plate 195 is coupled to a second surface 198 of membrane 170, and the second surface 197 of the touch overlay plate 195 faces in an opposite axial direction from the first surface 196 and receives force input from the user. For example, in one implementation, the second surface 198 of the membrane 170 and the central portion 201 of the first surface 196 of the touch overlay plate 195 are adhered together.

Figure 3:
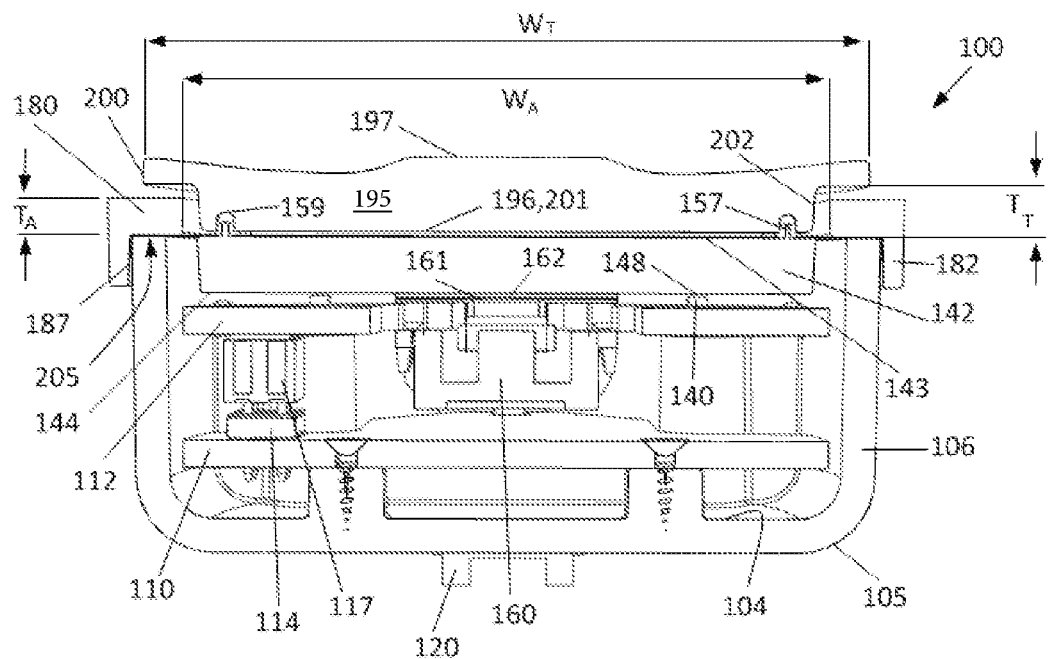
FIG. 3 illustrates a cross sectional view of a partially assembled switch assembly as taken through the C-C line in FIG. 1.

In some implementations, at least a portion of the second surface 197 of the touch overlay plate 195 is textured differently than the portion of the vehicle adjacent to the switch assembly 100 to allow the user to identify where the touch overlay plate 195 is in the vehicle without having to look for it. And, in some implementations, as shown in FIG. 3, the second surface 197 includes a non-planar surface. For example, the contour of the non-planar surface may be customized based on various applications of the assembly and/or to facilitate the user locating the second surface 197 without having to look for it.

In some implementations, icons are disposed on the touch overlay plate 195, and light exiting the second surface 143 of the light guide 142 passes through the membrane 170 and the icons on the touch overlay plate 195 to illuminate the icons. For example, by providing icons on a sheet that is adhesively coupled to the touch overlay plate 195, the icons are easily customizable for each vehicle manufacturer, and the switch assembly 100 is manufactured efficiently.

In some implementations, the flexible membrane 170 oscillates in the z-direction in response to receiving vibrational energy from the haptic exciter 160 via the light guide 142, and this oscillation is transferred to the touch overlay plate 195 to provide the haptic feedback to the user. Furthermore, the haptic response of the switch assembly 100 is tunable by selecting a light guide 142, membrane 170, and touch overlay plate 195 that together have a certain stiffness.

In addition, to isolate the vibration of the light guide 142 and touch overlay plate 195 from the housing 102 and PCBs 110, 112 and to ensure that the light guide 142 and touch overlay plate 195 do not rotate about the central axis A-A, an interlocking mechanism is employed to couple the light guide 142 and the touch overlay plate 195, according to some implementations. For example, as shown in FIGS. 3, 6, 9A, 11, and 12, the second surface 143 of the light guide 142 defines a second set of protrusions 157 that extend axially away from the second surface 143. The second set of protrusions 157 includes two or more protrusions, and the protrusions 157 are spaced apart from each other. The protrusions 157 are disposed radially inward of and adjacent the side edge 145 of the light guide 142. The flexible membrane 170 defines openings 158 through which the protrusions 157 extend. And, the first surface 196 of the touch overlay plate 195 defines recessed portions 159 that extend axially into the first surface 196. Distal ends of the protrusions 157 extend and are seated within the recessed portion 159. In the implementation shown in FIGS. 9A and 12, there are four recessed portions 159 defined in the touch overlay plate 195 and three protrusions 157 extending from the second surface 143 of the light guide 142. Having one or more additional recessed portions 159 allows parts to be standardized such that they can be used in different areas of the vehicle (e.g., left side or right side). However, in other implementations, the interlocking mechanism may include one or more protrusions and recessed portions.

In some implementations, a portion or all of the touch overlay plate 195 is comprised of a transparent or translucent material allows light to pass through the touch overlay plate 195. For example, the touch overlay plate 195 may comprise a piece of clear, contoured glass. Other transparent or translucent materials can be used, including other crystal materials or plastics like polycarbonate, for example. In some implementations the contoured nature of one side, the second side 197, of the touch overlay plate 195 allows the user to move around their finger to find the right button location without having to initiate the switch past the force threshold.

The annular frame 180 includes an annular wall 181 and a side wall 182 that extends axially from adjacent an outer radial edge 183 of the annular wall 181. The annular wall 181 includes an inner radial edge 184 that defines an opening 185 having a central axis B-B. The annular wall 181 also defines one or more post openings 186 between the inner radial edge 184 and the outer radial edge 183. The annular frame 180 is coupled to the second wall 106 of the housing 102. When coupled together, an inner surface 187 of the side wall 182 is disposed adjacent an outer surface 107 of the second wall 106. A portion of the membrane 170 adjacent the outer radial edge 175 of the membrane 170 is disposed between the annular wall 181 and the distal edge 172 of the second wall 106. Posts 173 are engaged through openings 174 defined in the membrane 170 and within respective post openings 186 of annular wall 181 to prevent movement in the x-y plane of the annular frame 180 relative to the housing 102. When coupled, the axis B-B of the annular frame 180 is coaxial with axis A-A of the housing 102. In the implementation shown, at least a portion of the outer radial edge 175 of the membrane 170 folds over the distal edge 172 of the second wall 106 and is disposed between the inner surface 187 of side wall 182 of the annular frame 180 and the outer surface 107 of the second wall 106. Furthermore, protrusions 157 are disposed radially inward of the inner radial edge 184 of the annular wall 181 when the annular frame 180 is coupled to the housing 102.

Fastener openings 188 are defined in the annular wall 181, and fastener openings 177 are defined by the second wall 106 of the housing 102. Fasteners 189 are engaged through aligned pairs of openings 188, 177 to couple the annular frame 180 to the housing 102. For example, in the implementation shown in FIGS. 1-12, the annular wall 181 includes radial extensions 181a that extend radially outwardly from the wall 181 and define the fastener openings 188. And, radial extensions 106a extend radially outwardly from the wall 106 and define fastener openings 177. However, in other implementations, the annular frame 180 is coupled to the housing 102 using other fastening arrangements. For example, in some implementations, the annular frame 180 is coupled to the housing 102 via fasteners extending through the side wall 182 of the annular frame 180 and the outer surface 107 of the second wall 106 of the housing 102. In other implementations, the annular frame 180 is coupled to the housing 102 using a friction fit, snaps, clips, rivets, adhesive, or other suitable fastening mechanism.

In certain implementations, one or more springs are disposed between the annular wall 181 of the annular frame 180 and the light guide 142 to urge the light guide 142 toward the second surface 123 of the second PCB 112. By disposing one or more springs between the annular wall 181, which is fixedly coupled to the housing 102, and the light guide 142, the one or more springs pre-load the force sensors 140. For example, the one or more springs may pre-load the force sensors to between 1 and 5 N. In one non-limiting example, the one or more springs pre-load the force sensors to 2.8 N. For example, in the implementation shown in FIGS. 1-12, the springs include coil springs 190 that extend between a first surface 205 of the annular wall 181 and the second surface 143 of the light guide 142. Axial depressions 206 are defined in a recessed portion 207 defined by the second surface 143 of the light guide 142 and the side edge 145 of the light guide 142. The recessed portions 207 have a surface that is axially spaced apart from the second surface 143 of the light guide 142 in a direction toward the first surface 144 of the light guide 142. Inward radial extensions 204 extend radially inwardly from the inner radial edge 184 of the annular wall 181. The inward radial extensions 204 also define axial depressions 306 according to some implementations. The axial depressions 306 defined by the inward radial extensions 204 are axially aligned with the axial depressions 206 defined by the light guide 142, and ends of each spring 190 seats in the respective axially aligned axial depression 306 of the inward radial extension 204 and the axial depression 206 of the light guide 142 to prevent movement of the coil spring 190 in the x-y plane. In addition, the membrane 170 defines spring recesses 178 that extend radially inwardly from the outer radial edge 175 of the membrane 170, and the springs 190 extend through the recesses 178 and are spaced apart from the outer radial edge 175 of the membrane 170 so as not to interfere with the oscillation of the membrane 170.

Figure 19A:
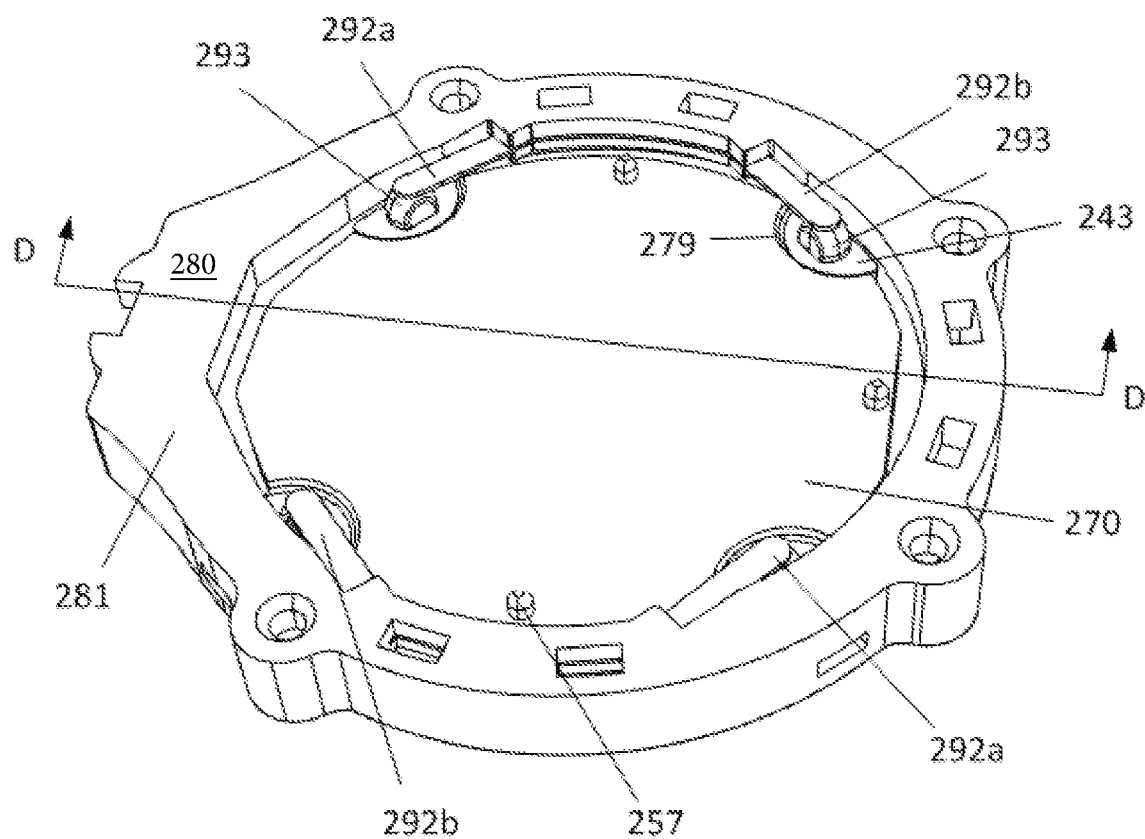
FIG. 19A illustrates a perspective view of a portion of a switch assembly according to another implementation.
Figure 19B:
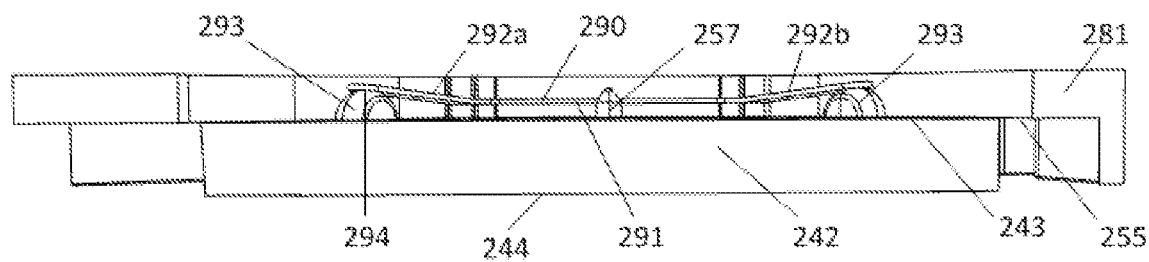
FIG. 19B illustrates a cross sectional view of the portion of the switch assembly shown in FIG. 19A as taken through the D-D line.
Figure 19C:
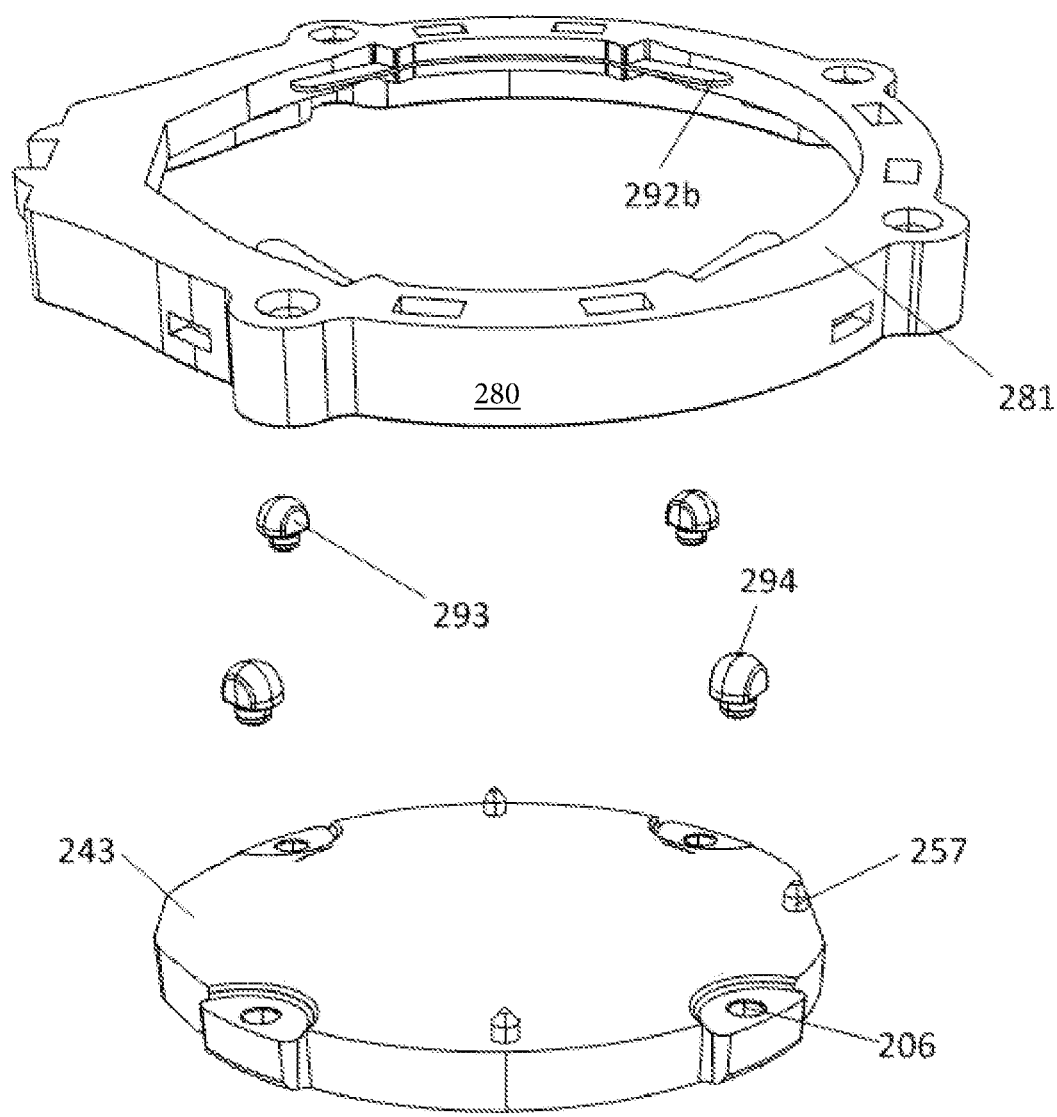
FIG. 19C illustrates an exploded view of the portion of the switch assembly shown in FIG. 19A.
Figure 20A:
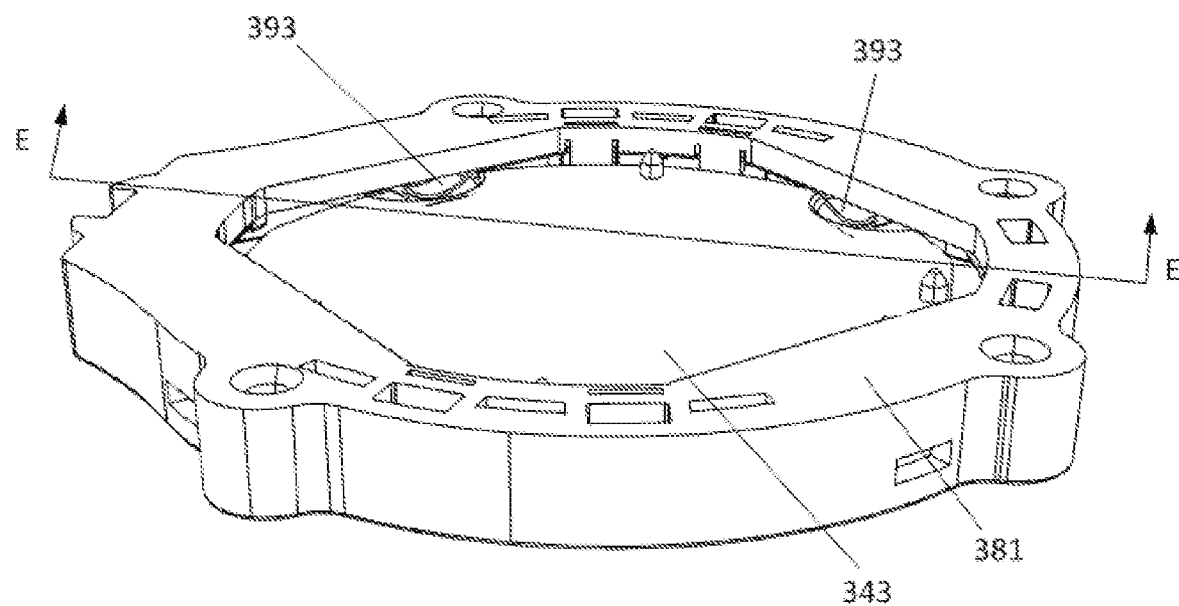
FIG. 20A illustrates a perspective view of a portion of a switch assembly according to another implementation.
Figure 20B:
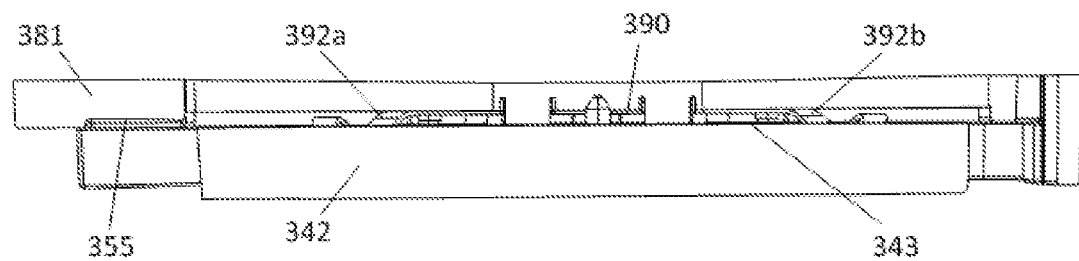
FIG. 20B illustrates a cross sectional view of the portion of the switch assembly shown in FIG. 20A as taken through the E-E line.
Figure 20C:
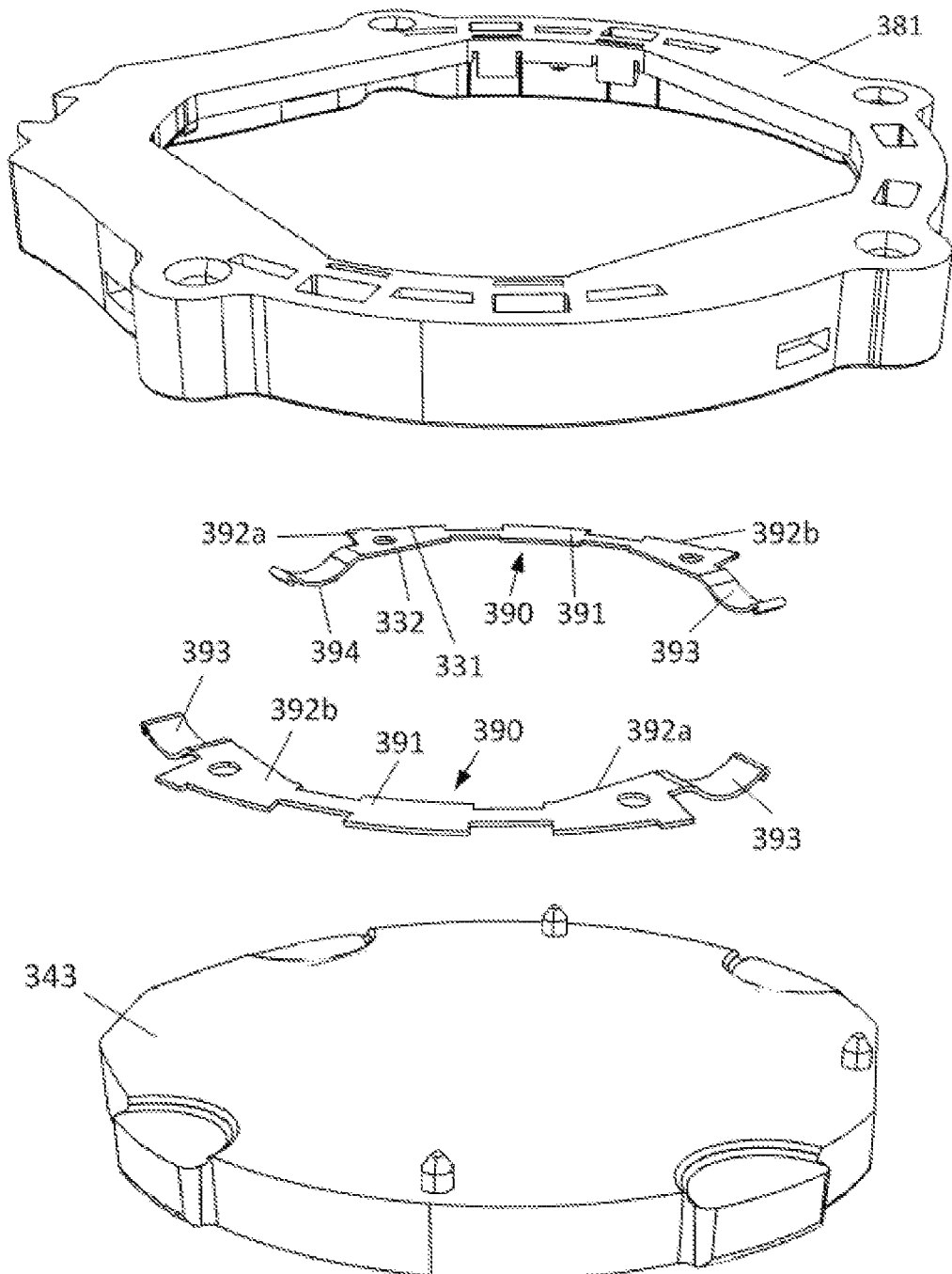
FIG. 20C illustrates an exploded view of the portion of the switch assembly shown in FIG. 20A.
Figure 20D:
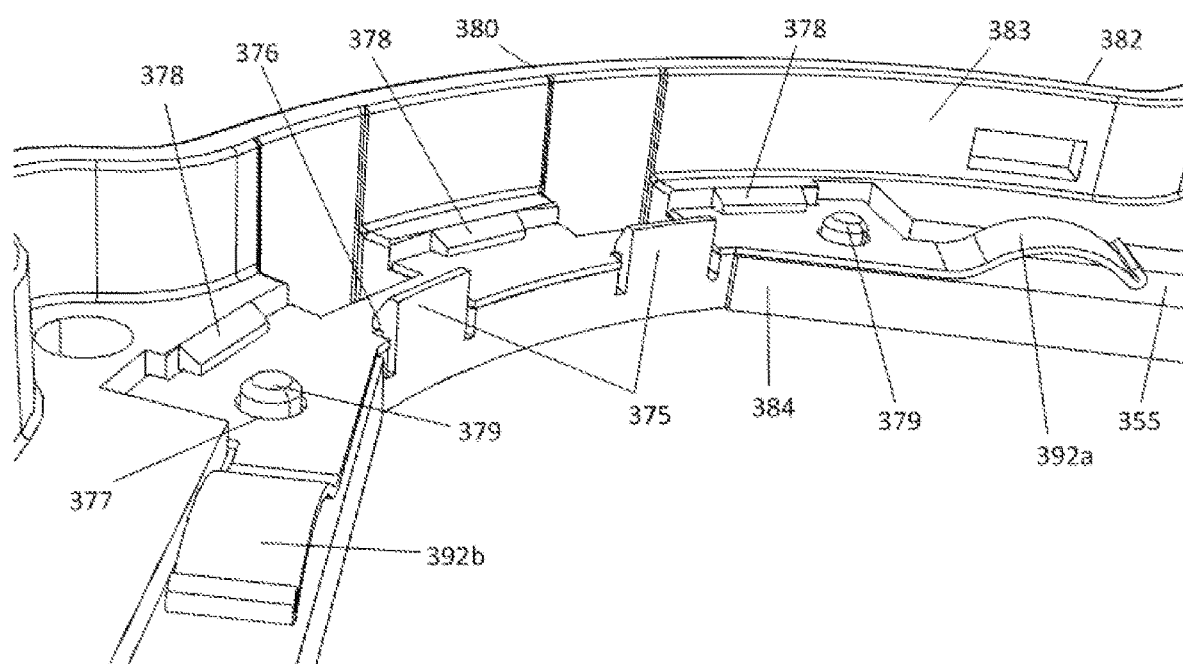
FIG. 20D illustrates a perspective view of a portion of the switch assembly shown in FIG. 20A.

In the implementation shown in FIGS. 19A-19C, the springs are leaf springs 290. The leaf springs 290 include a central portion 291 and leg portions 292a, 292b. Leg portions 292a, 292b extend circumferentially from and radially inwardly from the central portion 291. The second surface 243 of the light guide 242 includes a plurality of posts 293 that extend axially away from the second surface 243, and the membrane 270 defines openings 279 through which the posts 293 extend. The central portion 291 of each leaf spring 290 is coupled to the first surface 255 of the annular wall 281 of the annular frame 280, and the leg portions 292a, 292b engage distal ends 294 of posts 293. When assembled, a plane that includes the first surface 255 of the annular wall 281 to which the central portion 291 of the leaf spring 290 is coupled is axially between a plane that includes the distal ends 294 of the posts 293 and a plane that includes the second surface 243 of the light guide 242. Thus, the leg portions 292a, 292b of the leaf spring 290 are biased toward the light guide 242 and urge the first surface 244 of the light guide 242 toward the second PCB 112. It is to be appreciated that the posts 293 may be separately formed from the light guide 242, or they can be integrally formed with the light guide 242.

FIG. 19B also shows a second set of protrusions 257, which are similar to the second set of protrusions 157 shown in FIGS. 3, 6, 9A, 11, and 12, that extend axially away from the second surface 243 of the light guide 242. The second set of protrusions 257 includes three protrusions, and the protrusions 257 are spaced apart from each other. The protrusions 257 are disposed radially inward of and adjacent the side edge 245 of the light guide 242. Like the protrusions 157 described above, the protrusions 257 extend through openings in the membrane and into recessed portions defined by the first surface of the touch overlay.

FIGS. 20A-20D illustrate leaf spring 390 according to another implementation. In this implementation, the leaf spring 390 includes a central portion 391 and leg portions 392a, 392b that extend circumferentially from and radially inwardly from the central portion 391. Each leg portion 392a, 392b also includes an arcuate portion 393 having an apex 394 that is within a plane that is spaced apart from a plane that includes the central portion 391. The central portion 391 is coupled to the first surface 355 of an annular wall 381, and the apex 394 of each arcuate portion 393 abuts the second surface 343 of the light guide 342. The arcuate portion 393 maintains a minimum axial spacing between the second surface 343 of the light guide 342 and the first surface 355 of the annular wall 381.

At least a portion of the leaf spring 390 is coupled to the annular frame 380. The inner radial edge 384 of the annular wall 381 includes one or more resilient tabs 375 that extend axially in a first direction (i.e., in a direction away from and orthogonal to the first surface 355 of the annular wall 381) from the inner radial edge 384. Each resilient tabs 375 has a shoulder 376 that extends radially outwardly from the tab 375 toward the first surface 355 of the annular wall 381. Each shoulder 376 is axially spaced apart from the first surface 355 of the annular wall 381. The side wall 382 of the annular frame 380 also includes one or more tabs 378 that extend radially inwardly from an inner surface 383 of the side wall 382. The one or more tabs 378 are axially spaced apart from the first surface 355 of the annular wall 381. The first surface 355 of the annular wall 381 includes one or more protrusions 379 that extend axially in the first direction from the first surface 355. A radially outer edge 331 of the central portion 391 of the leaf spring 390 is urged axially between tabs 378 and the first surface 355 of the annular wall 381, and a radially inner edge 332 of the central portion 391 is urged against the resilient tabs 375, which causes the resilient tabs 375 to bend radially inwardly as the leaf spring 390 passes by the shoulders 376 and is disposed between the shoulders 376 and the first surface 355 of the annular wall 381. Also, a concave surface of each arcuate portion 393 is positioned to face axially toward the first surface 355 of the annular wall 381 such that the apex 394 faces away from the first surface 355. The leaf spring 390 defines one or more openings 377 that align with the one or more protrusions 379, and the protrusions 379 extend through the openings 377 when the edges 331, 332 are disposed between the tabs 375, 378 and the first surface 355 of the annular wall 381. The tabs 375, 378 hold the leaf spring 390 axially and radially adjacent the annular frame 380, and the protrusions 376 engaged through the openings 377 prevent the leaf spring 390 from circumferential movement relative to the annular frame 380.

In other implementations, the leaf spring 290, 390 is overmolded with a portion of the annular frame 280, 380 over the central portion 291, 391 thereof. And, in some implementations, the spring 290, 390 may be adhered to, snapped to, or otherwise fastened to the annular frame 280, 390.

In addition, according to various implementations, the leaf spring 290, 390 may comprise a spring steel plate.

Figure 12:
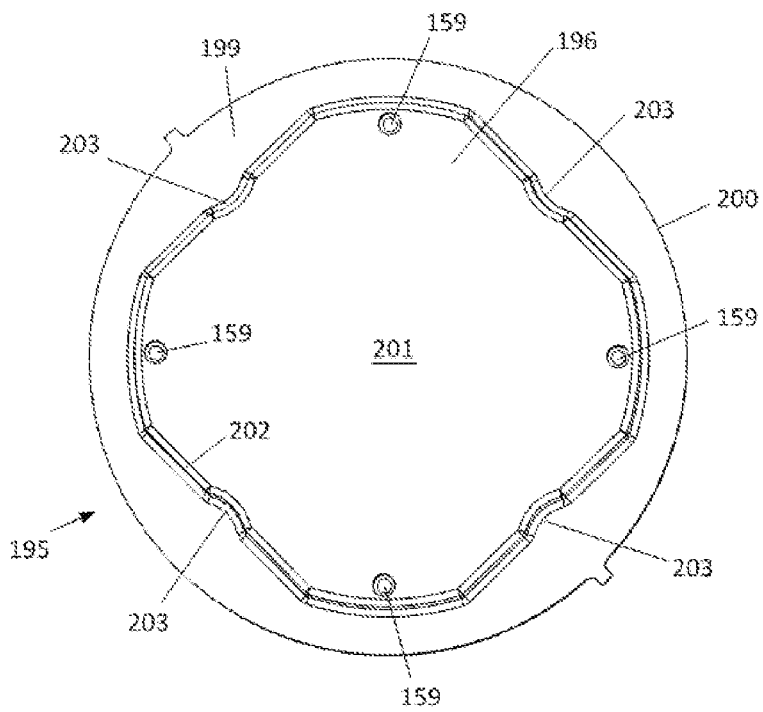
FIG. 12 illustrates a plan view of the first surface of the touch overlay plate shown in FIG. 1.

The central portion 201 of the touch overlay plate 195 is disposed within the opening 185 defined by the inner radial edge 184 of the annular wall 181 and is coupled to the membrane 170, as described above. As shown in FIG. 12, the first surface 196 of the touch overlay plate 195 defines a recessed portion 199 adjacent an outer radial edge 200 of the touch overlay plate 195. The recessed portion 199 and an outer radial edge 202 of the central portion 201 of the first surface 196 further define a plurality of depressions 203 (or grooves) that extend axially from the first surface 196 of the central portion 201 to the annular recessed portion 199 and radially inwardly from the outer radial edge 202. To prevent the touch overlay plate 195 from contacting the annular frame 180, the depressions 203 are spaced radially inwardly of the radial extensions 204 of the annular wall 181 of the annular frame 180. In addition, the distance TT between the surface of the annular recessed portion 199 and the surface of the central portion 201 is greater than a thickness TA (as measured in the z- or axial direction) of the annular wall 181. And, a diameter (or width WT) of the second surface 197 of the touch overlay plate 195 is greater than a diameter (or width WA) of the annular wall 181 such that the touch overlay plate 195 hides the annular wall 181 when the assembly 100 is viewed from the second surface 197 of the touch overlay plate 195.

In some implementations, such as those described above, the distal edge 172 of the second wall 106 of the housing 102, the annular frame 180, the light guide 142, and the outer radial edge 200 of the touch overlay plate 195 are generally circular. However, in other implementations, these portions of the switch assembly may have a non-circular shape, such as triangular, rectangular, or other suitable polygonal shape.

In other implementation, the switch assembly includes just one PCB on which the force sensors are disposed. In such implementations, the circuitry required to operate the switch fits on the one PCB.

In addition, in other implementations, the switch assembly may include just one PCB and one force sensor for applications that require output from one force sensor (output that is not position specific).

In some implementations, the switch assemblies described above are mountable within a vehicle. For example, the switch assemblies are mountable to a steering wheel, such as to the bevel or hub of the steering wheel, for use in controlling various vehicle systems. In other examples, the switch assemblies are mountable to a vehicle door, gear shifter, dashboard, or any portion of the vehicle where input can be provided and used to control one or more vehicle systems.

For example, in some implementations, such as those described above, the housing is coupled to a trim piece in the vehicle instead of a frame or support portion of the vehicle, which isolates the vibration from the haptic exciter from other portions of the vehicle. This arrangement also allows the gap between edges of the trim piece and the outer edge of the assembly to be minimized because the trim piece can move with the assembly. To couple the housing to the trim piece (or other portion of the vehicle), bosses 208 that extend radially outwardly from the outer surface of second wall are aligned with openings defined adjacent the portion of the vehicle to which the switch assembly is being coupled. A fastener is engaged through the aligned openings to secure the assembly to the vehicle.

Figure 14:
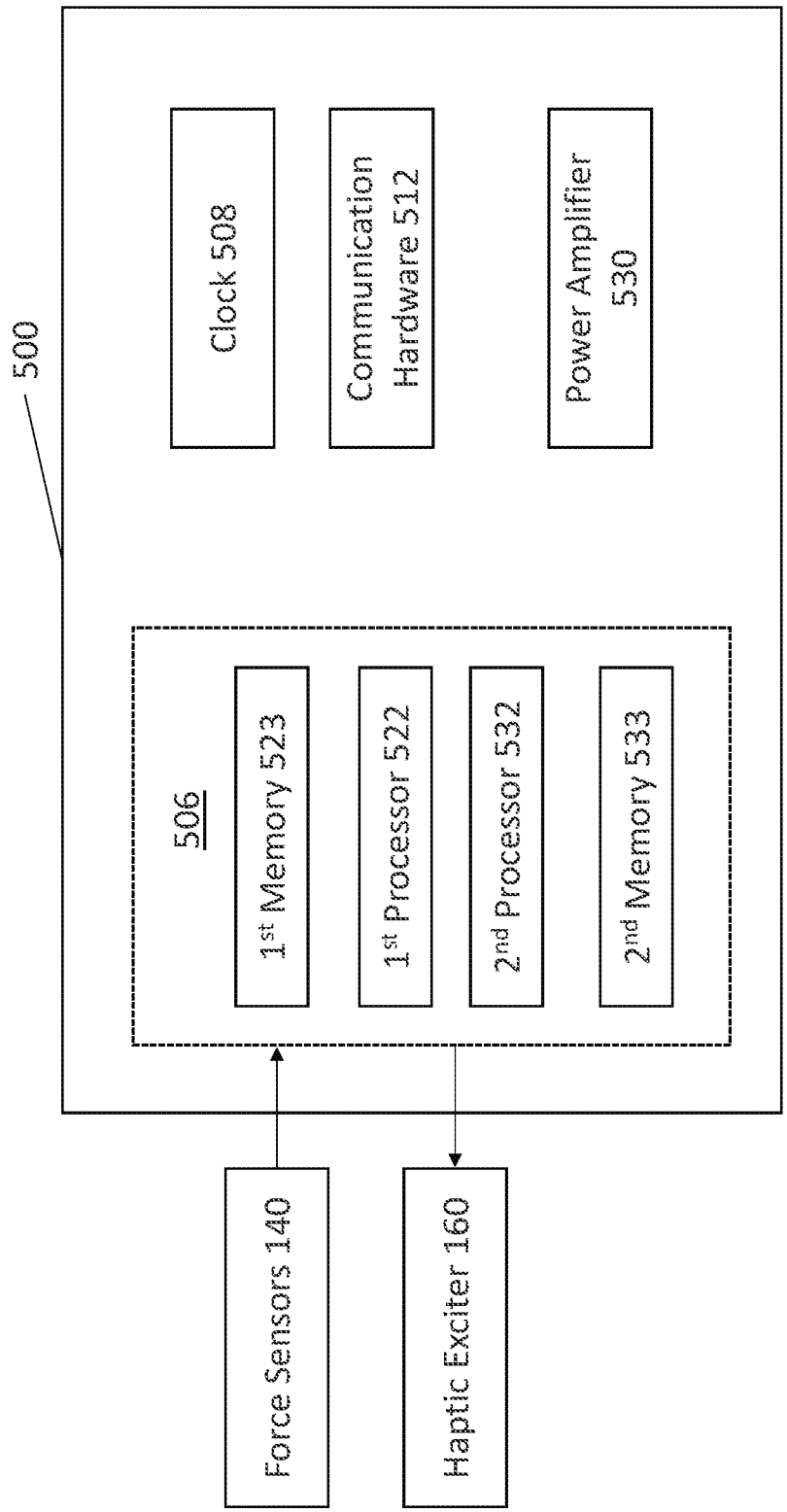
FIG. 14 illustrates a block diagram of an electrical control system according to one implementation.

FIG. 14 illustrates a block diagram of the electrical control system 500, according to one implementation. The electrical control system 500 may include a computing unit 506, a system clock 508, and communication hardware 512. In its most basic form, the computing unit 506 includes a processor 522 and a system memory 523 disposed on the second PCB 112. The processor 522 may be standard programmable processors that perform arithmetic and logic operations necessary for operation of the electrical control system 500. The processor 522 may be configured to execute program code encoded in tangible, computer-readable media. For example, the processor 522 may execute program code stored in the system memory 523, which may be volatile or non-volatile memory. The memory 523, which can be embodied within non-transitory computer readable media, stores instructions for execution by the processor 522. The system memory 523 is only one example of tangible, computer-readable media. In one aspect, the computing unit 506 can be considered an integrated device such as firmware. Other examples of tangible, computer-readable media include floppy disks, CD-ROMs, DVDs, hard drives, flash memory, or any other machine-readable storage media, wherein when the program code is loaded into and executed by a machine, such as the processors 522, 532, the machine becomes an apparatus for practicing the disclosed subject matter.

In addition, the processor 522 is in electrical communication with the force sensors 140. In some implementations, the system 500 further includes a transceiver that is in electrical communication with the processor 522 and one or more vehicle systems. And, in some implementations, the system 500 further includes a power amplifier 530 that is in electrical communication with the processor 522 and the haptic exciter 160.

However, in other implementations, the system 500 includes two or more processors and/or memories, and the processors and/or memories may be disposed on the first and/or second PCBs. And, in other implementations, the assembly includes one or more PCBs on which one or more force sensors, one or more memories, and one or more processors are disposed.

Aspects of the present invention are described above with reference to flowchart illustrations and/or block diagrams of methods, apparatus (systems) and computer program products according to implementations of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 15:
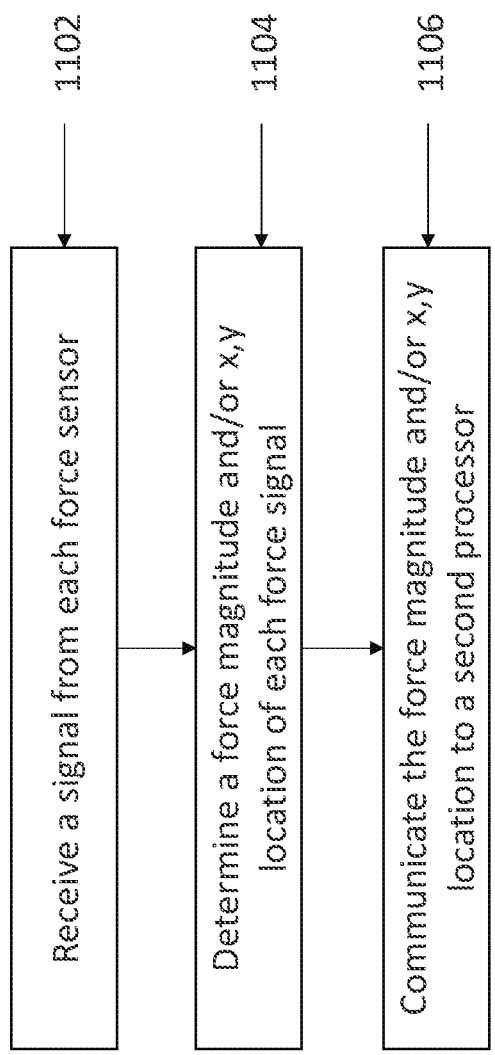
FIG. 15 illustrates a flow diagram of instructions stored on a memory for execution by a processor disposed on the second PCB, according to one implementation.

FIG. 15 illustrates a flow diagram of instructions stored in the first memory 523 for execution by the first processor 522 according to one implementation. The instructions cause the first processor 522 to: (1) receive a signal from each of the one or more force sensors 140, the signal being associated with a force received by each of the force sensors 140, as shown in step 1102, (2) determine a force magnitude and/or x,y location associated with the received force signals, as shown in step 1104, and (3) communicate the force magnitude and/or x,y location to the second processor 532 disposed on the first PCB 110, as shown in step 1106. Having the force sensors 140 in close proximity to the first processor 522 that initially processes the signals from the force sensors 140 reduces the likelihood of noise in the signals.

Figure 16:
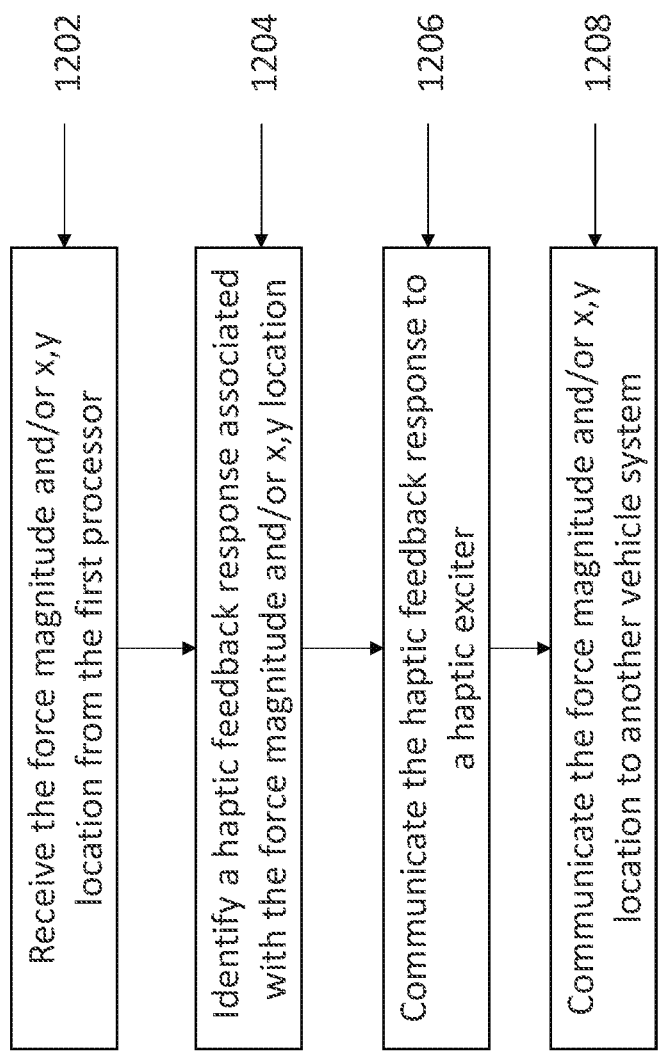
FIG. 16 illustrates a flow diagram of instructions stored on a memory for execution by a processor disposed on the first PCB, according to one implementation.

FIG. 16 illustrates a flow diagram of instructions stored in the second memory 533 for execution by the second processor 532. The instructions stored in the second memory 533 cause the second processor 532 to: (1) receive the force magnitude and/or x,y location from the first processor 522, as shown in step 1202, (2) identify a haptic feedback response associated with the force magnitude and/or x,y location, as shown in step 1204, (3) communicate the haptic feedback response to a haptic exciter 160, as shown in step 1206, and (4) communicate the x,y location and/or the force magnitude to another vehicle system, as shown in step 1208. The switch assembly 100 according to one implementation may be configured for controlling up to 32 functions.

Figure 17:
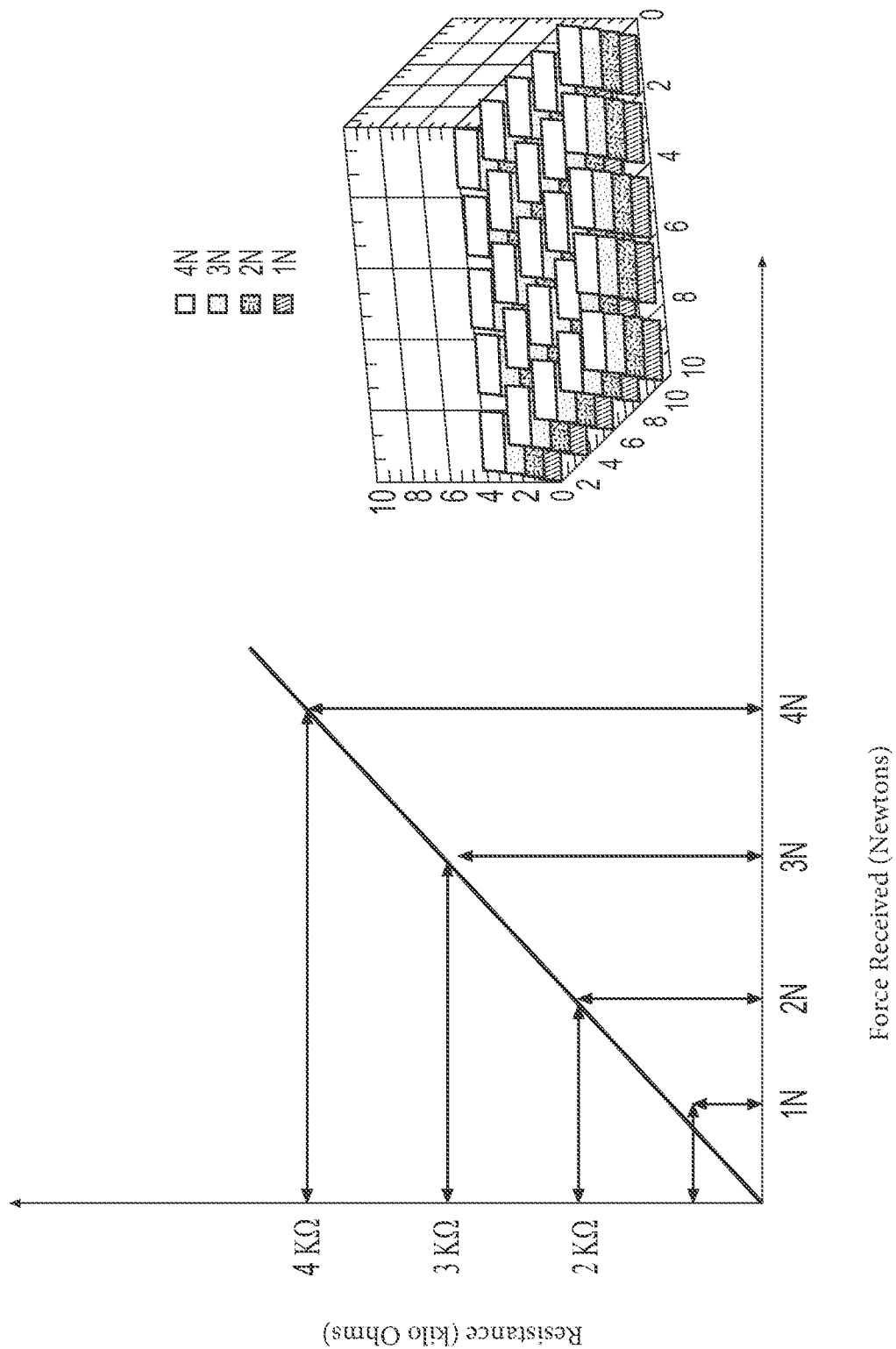
FIG. 17 illustrates a graph of a resistance sensed by the force sensors and a corresponding force signal associated with each resistance level, according to one implementation.
Figure 18A:
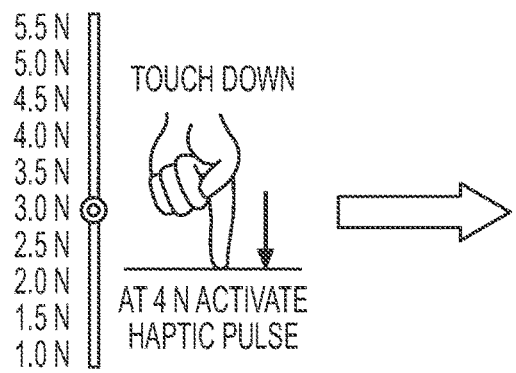
FIGS. 18A-18D illustrate exemplary touch events and a corresponding haptic response to each touch event, according to one implementation.
Figure 18A:
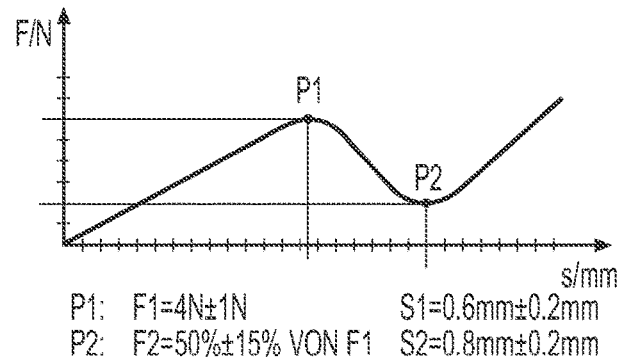
Figure 18B:
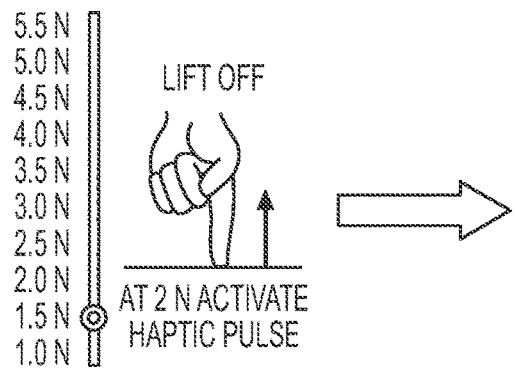
Figure 18B:
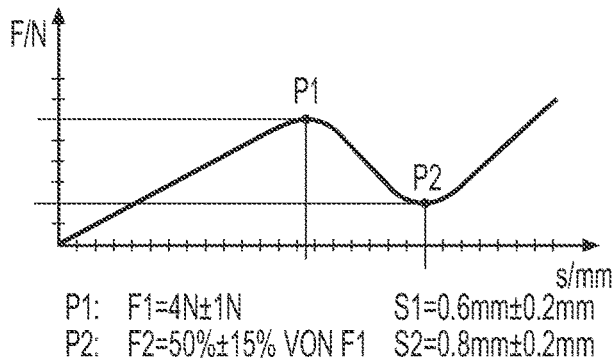
Figure 18C:
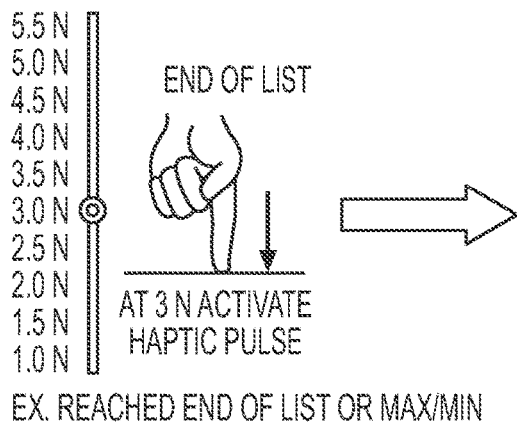
Figure 18C:
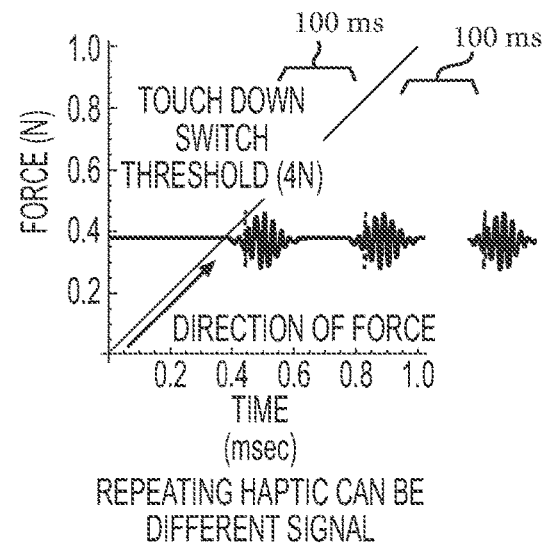
Figure 18D:
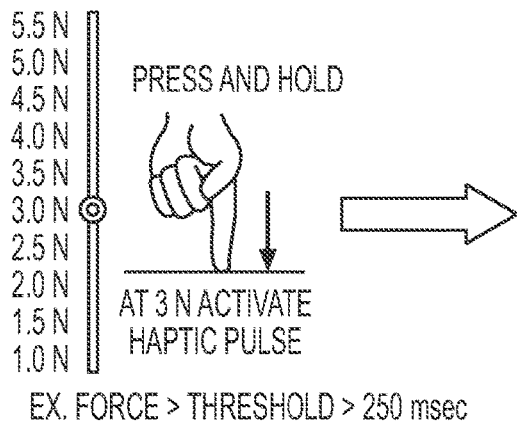
Figure 18D:
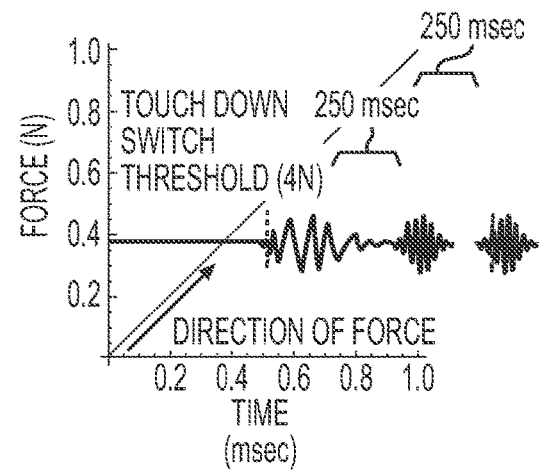

The force sensors 140 each receive a portion of the force applied to the touch overlay 195, and the force received by each sensor 140 is processed by the first processor 522 to determine a position and magnitude of the force applied. The position of the force is determined by the portion of the force received by each force sensor 140 and their known location relative to each other. For example, in the implementation shown in FIG. 17, the force received by each sensor 140 (shown on the x-axis) is associated with a resistance (shown on the y-axis). The position of the applied force is measured in either one dimension (e.g., the x- or y-dimension) or two dimensions (e.g., the x- and y-directions or plane), and the magnitude of the force is measured in the z-direction. In the implementation shown in FIGS. 1-12, which has four force sensors 140, the position of the force is determined by quad-angulation of the force signals received from each sensor 140. In further or alternative implementations, the position of the force is determined by tri-angulation using three force sensors. For example, if one of the four force sensors 140 fails during operation, the location is determined by tri-angulation using the force signal received from the remaining three sensors 140.

The switch assembly 100 also senses the time that a force is applied at a particular location. For example, the memory 523 may store processing parameters, such as a range of force over time values that indicate an input signal has been received. Input received outside of the range may be ignored by the system as unintentional contact with the switch assembly 100. For example, the upper limit of the input range may be 10N of force applied for 20 seconds or less. Furthermore, the switch assembly 100 may also set a force threshold for locking an input area (e.g., 2.5 N) around a location of force input and a second, higher threshold for a force received within the input area for enabling the system 100 (e.g., 3 N). Additional description of force thresholds and virtual input areas are provided in U.S. Patent Application Publication Nos. 2015/0097791 and 2015/0097795, both published Apr. 9, 2015, which are included in the Appendix to this application.

In response to the magnitude, location, and/or duration of the applied force meeting the input parameters, the switch assembly 100 generates a haptic and/or audible feedback signal responsive to the detected force. For example, the haptic and/or audible feedback signal may be proportional to the force received. As shown in FIGS. 18A-D, each touch event (e.g., touch-down shown in FIG. 18A, lift-off shown in FIG. 18B, end of list shown in FIG. 18C, and hold-down shown in FIG. 18D) is initiated by a different user interaction (e.g., different force value and/or duration of the touch) and, accordingly, can trigger different haptic and/or audible output feedbacks provided to the user. Exemplary haptic and/or audible feedback signal responses are described in U.S. Patent Application Publication Nos. 2015/0097794 and 2015/0097793, both published Apr. 9, 2015, which are included in the Appendix to this application.

The drawings illustrate the switch assembly as viewed in an upright orientation in which the central longitudinal axis A-A is vertically oriented. However, the orientation shown in the drawings should not limit how the switch assembly may be oriented within the vehicle. For example, in various implementations, the switch assembly is disposed in the vehicle such that the central longitudinal axis A-A is horizontal or has a horizontal component relative to the ground.

The terminology used herein is for the purpose of describing particular implementations only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The implementation was chosen and described in order to best explain the principles of the invention and the practical application, and to enable others of ordinary skill in the art to understand the invention for various implementations with various modifications as are suited to the particular use contemplated.

The invention claimed is:

1. A switch assembly comprising:
a housing having one or more walls that define a chamber;
a printed circuit board (PCB) disposed within the chamber, the PCB having a first surface that faces in a first axial direction and a second surface that faces in a second axial direction, the second axial direction being opposite from the first axial direction, the PCB comprising a force sensor disposed on the second surface;
a frame coupled to at least one of the one or more walls of the housing;
a light guide disposed axially between the frame and the second surface of the PCB; and
a spring disposed adjacent the light guide, the spring urging the light guide in the first axial direction toward the PCB to pre-load the force sensor.

2. The switch assembly of claim 1, wherein the spring pre-loads the force sensor to between 1 and 5 N.

3. The switch assembly of claim 2, wherein the spring pre-loads the force sensor to 2.8 N.

4. The switch assembly of claim 1, wherein the spring is a coil spring having a first end and a second end.

5. The switch assembly of claim 4, wherein the light guide comprises a first surface that faces in the first axial direction and a second surface that faces in the second axial direction, the second surface of the light guide defining an axial depression, wherein the first end of the coil spring is disposed within the axial depression.

6. The switch assembly of claim 5, wherein the frame comprises an axial depression which is axially aligned with the axial depression of the light guide, wherein the second end of the coil spring is disposed within the axial depression of the frame.

7. The switch assembly of claim 1, wherein the light guide comprises a first surface that faces in the first axial direction and a second surface that faces in the second axial direction, wherein light guide comprises a post extending in the second axial direction from the second surface of the light guide.

8. The switch assembly of claim 7, wherein the spring is a leaf spring having a central portion and a leg portion, the leg portion extending from the central portion.

9. The switch assembly of claim 8, wherein the leg portion engages the post to urge the light guide in the first axial direction toward the PCB to pre-load the force sensor.

10. The switch assembly of claim 9, wherein the central portion is coupled to the frame.

11. The switch assembly of claim 9, wherein the central portion is overmolded with a portion of the frame.

12. The switch assembly of claim 9, wherein the post is formed separately from the light guide and coupled to the light guide.

13. The switch assembly of claim 9, wherein the post if formed integrally with the light guide.

14. The switch assembly of claim 1, wherein the spring is a leaf spring having a central portion and a leg portion, the leg portion extending from the central portion and comprising an arcuate portion having an apex.

15. The switch assembly of claim 14, wherein the apex lies within a plane that is spaced apart from a plane that includes the central portion.

16. The switch assembly of claim 15, wherein the light guide comprises a first surface that faces in the first axial direction and a second surface that faces in the second axial direction, wherein the apex abuts the second surface of the light guide to urge the light guide in the first axial direction toward the PCB to pre-load the force sensor.

17. The switch assembly of claim 14, wherein the central portion is coupled to the frame.

18. The switch assembly of claim 17, wherein the frame comprises a tab having a shoulder, the tab extending from a surface of the frame, wherein the central portion is disposed axially between the shoulder and the surface of the frame.

19. The switch assembly of claim 17, wherein the frame comprises a protrusion and the central portion defines an opening, wherein the protrusion extends through the opening.

20. The switch assembly of claim 14, wherein the central portion is overmolded with a portion of the frame.

\* \* \* \* \*